United States Patent
Filson et al.

(10) Patent No.: US 9,127,853 B2
(45) Date of Patent: Sep. 8, 2015

(54) THERMOSTAT WITH RING-SHAPED CONTROL MEMBER

(71) Applicant: Google Inc., Mountain View, CA (US)

(72) Inventors: John Benjamin Filson, Mountain View, CA (US); Eric B. Daniels, East Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/624,811

(22) Filed: Sep. 21, 2012

(65) Prior Publication Data

US 2013/0099009 A1    Apr. 25, 2013

Related U.S. Application Data

(63) Continuation of application No. 13/033,573, filed on Feb. 23, 2011.

(60) Provisional application No. 61/415,771, filed on Nov. 19, 2010, provisional application No. 61/429,093, filed on Dec. 31, 2010, provisional application No. 61/627,996, filed on Oct. 21, 2011.

(51) Int. Cl.
*G05D 23/00* (2006.01)
*F24F 11/00* (2006.01)
(Continued)

(52) U.S. Cl.
CPC ............. *F24F 11/0034* (2013.01); *F24F 11/00* (2013.01); *F24F 11/001* (2013.01); *F24F 11/006* (2013.01); *F24F 11/0009* (2013.01); *F24F 11/0012* (2013.01);
(Continued)

(58) Field of Classification Search
CPC .......... G05D 23/1932; G05D 23/1902; G05D 23/1905; G05D 23/1917; F24F 11/0012; F24F 11/0086; H01H 25/06; H01H 19/11
USPC .......... 236/51, 49.3, 94; 700/276, 278; 200/4, 200/316, 336, 564
See application file for complete search history.

(56) References Cited

U.S. PATENT DOCUMENTS 2,558,648 A    6/1951    Warner
3,991,357 A    11/1976    Kaminski
(Continued)

FOREIGN PATENT DOCUMENTS

CA    2202008    2/2000
DE    196 09 390 A1    9/1997
(Continued)

OTHER PUBLICATIONS

Ambient Devices Energy Joule Web Page, http://www.ambientdevices.com/products/energyjoule.html, Cambridge Massachusetts, Ambient Devices Undated, 2 Pages.
(Continued)

*Primary Examiner* — Frantz Jules
*Assistant Examiner* — Azim Abdur Rahim
(74) *Attorney, Agent, or Firm* — Kilpatrick Townsend & Stockton LLP

(57) ABSTRACT

A sleek, low-profile wall-mountable thermostat for controlling an HVAC system is described. The thermostat includes a ring-shaped controller that rotates about a central axis, and an optical sensor directed away from the central axis and toward a radially inward-facing surface of the ring-shaped controller so as to accurately detect optical signals indicating controller's rotational movement.

14 Claims, 17 Drawing Sheets

(51) Int. Cl.

| | | |
|---|---|---|
| G05D 23/19 | (2006.01) | |
| G05D 23/27 | (2006.01) | |
| G06F 3/0487 | (2013.01) | |
| G05D 23/24 | (2006.01) | |
| G01J 5/00 | (2006.01) | |
| G01J 5/04 | (2006.01) | |
| G06N 99/00 | (2010.01) | |
| H04L 29/08 | (2006.01) | |
| G01K 1/02 | (2006.01) | |

(52) U.S. Cl.
CPC ........ *F24F 11/0076* (2013.01); *F24F 11/0086* (2013.01); *G01J 5/0025* (2013.01); *G01J 5/041* (2013.01); *G01K 1/02* (2013.01); *G05D 23/19* (2013.01); *G05D 23/1902* (2013.01); *G05D 23/1919* (2013.01); *G05D 23/1932* (2013.01); *G05D 23/2434* (2013.01); *G05D 23/2723* (2013.01); *G06F 3/0487* (2013.01); *G06N 99/005* (2013.01); *H04L 67/10* (2013.01); *F24F 2011/0035* (2013.01); *F24F 2011/0036* (2013.01); *F24F 2011/0071* (2013.01); *F24F 2011/0091* (2013.01); *Y02B 60/50* (2013.01); *Y02T 10/88* (2013.01)

(56) References Cited

U.S. PATENT DOCUMENTS

| | | |
|---|---|---|
| 4,223,831 A | 9/1980 | Szarka |
| 4,316,577 A | 2/1982 | Adams et al. |
| 4,335,847 A | 6/1982 | Levine |
| 4,408,711 A | 10/1983 | Levine |
| 4,613,139 A | 9/1986 | Robinson, II |
| 4,615,380 A | 10/1986 | Beckey |
| 4,621,336 A | 11/1986 | Brown |
| 4,674,027 A | 6/1987 | Beckey |
| 4,685,614 A | 8/1987 | Levine |
| 4,751,961 A | 6/1988 | Levine et al. |
| 4,768,706 A | 9/1988 | Parfitt |
| 4,847,781 A | 7/1989 | Brown, III et al. |
| 4,876,457 A | 10/1989 | Bose |
| 4,897,798 A | 1/1990 | Cler |
| 4,971,136 A | 11/1990 | Mathur et al. |
| 4,997,029 A | 3/1991 | Otsuka et al. |
| 5,005,365 A | 4/1991 | Lynch |
| D321,903 S | 11/1991 | Chepaitis |
| 5,065,813 A | 11/1991 | Berkeley et al. |
| 5,088,645 A | 2/1992 | Bell |
| 5,115,967 A | 5/1992 | Wedekind |
| 5,211,332 A | 5/1993 | Adams |
| 5,224,648 A | 7/1993 | Simon et al. |
| 5,224,649 A | 7/1993 | Brown et al. |
| 5,240,178 A | 8/1993 | Dewolf et al. |
| 5,244,146 A | 9/1993 | Jefferson et al. |
| D341,848 S | 11/1993 | Bigelow et al. |
| 5,294,047 A | 3/1994 | Schwer et al. |
| 5,303,612 A * | 4/1994 | Odom et al. .................. 74/553 |
| 5,395,042 A | 3/1995 | Riley et al. |
| 5,415,346 A | 5/1995 | Bishop |
| 5,460,327 A | 10/1995 | Hill et al. |
| 5,462,225 A | 10/1995 | Massara et al. |
| 5,476,221 A | 12/1995 | Seymour |
| 5,482,209 A | 1/1996 | Cochran et al. |
| 5,485,954 A | 1/1996 | Guy et al. |
| 5,499,196 A | 3/1996 | Pacheco |
| 5,544,036 A | 8/1996 | Brown, Jr. et al. |
| 5,555,927 A | 9/1996 | Shah |
| 5,603,451 A | 2/1997 | Helander et al. |
| 5,611,484 A | 3/1997 | Uhrich |
| 5,627,531 A | 5/1997 | Posso et al. |
| 5,673,850 A | 10/1997 | Uptegraph |
| 5,761,083 A | 6/1998 | Brown, Jr. et al. |
| D396,488 S | 7/1998 | Kunkler |
| 5,779,143 A | 7/1998 | Michaud et al. |
| 5,782,296 A | 7/1998 | Mehta |
| 5,808,294 A | 9/1998 | Neumann |
| 5,808,602 A | 9/1998 | Sellers |
| 5,816,491 A | 10/1998 | Berkeley et al. |
| 5,902,183 A | 5/1999 | D'Souza |
| 5,909,378 A | 6/1999 | De Milleville |
| 5,918,474 A | 7/1999 | Khanpara et al. |
| 5,924,486 A | 7/1999 | Ehlers et al. |
| 5,931,378 A | 8/1999 | Schramm |
| 5,959,621 A | 9/1999 | Nawaz et al. |
| 5,973,662 A | 10/1999 | Singers et al. |
| 5,977,964 A | 11/1999 | Williams et al. |
| 6,020,881 A | 2/2000 | Naughton et al. |
| 6,032,867 A | 3/2000 | Dushane et al. |
| 6,062,482 A | 5/2000 | Gauthier et al. |
| 6,066,843 A | 5/2000 | Scheremeta |
| D428,399 S | 7/2000 | Kahn et al. |
| 6,095,427 A | 8/2000 | Hoium et al. |
| 6,098,893 A | 8/2000 | Berglund et al. |
| 6,122,603 A | 9/2000 | Budike, Jr. |
| 6,164,374 A | 12/2000 | Rhodes et al. |
| 6,206,295 B1 | 3/2001 | LaCoste |
| 6,211,921 B1 | 4/2001 | Cherian et al. |
| 6,213,404 B1 | 4/2001 | Dushane et al. |
| 6,216,956 B1 | 4/2001 | Ehlers et al. |
| 6,286,764 B1 | 9/2001 | Garvey et al. |
| 6,298,285 B1 | 10/2001 | Addink et al. |
| 6,311,105 B1 | 10/2001 | Budike, Jr. |
| D450,059 S | 11/2001 | Itou |
| 6,318,639 B1 | 11/2001 | Toth |
| 6,349,883 B1 | 2/2002 | Simmons et al. |
| 6,351,693 B1 | 2/2002 | Monie et al. |
| 6,356,204 B1 | 3/2002 | Guindi et al. |
| 6,370,894 B1 | 4/2002 | Thompson et al. |
| 6,415,205 B1 | 7/2002 | Myron et al. |
| 6,453,687 B2 | 9/2002 | Sharood et al. |
| D464,660 S | 10/2002 | Weng et al. |
| 6,478,233 B1 | 11/2002 | Shah |
| 6,502,758 B2 | 1/2003 | Cottrell |
| 6,513,723 B1 | 2/2003 | Mueller et al. |
| 6,519,509 B1 | 2/2003 | Nierlich et al. |
| D471,825 S | 3/2003 | Peabody |
| 6,574,581 B1 | 6/2003 | Bohrer et al. |
| 6,595,430 B1 | 7/2003 | Shah |
| 6,619,055 B1 | 9/2003 | Addy |
| 6,622,925 B2 | 9/2003 | Carner et al. |
| D480,401 S | 10/2003 | Kahn et al. |
| 6,636,197 B1 * | 10/2003 | Goldenberg et al. ......... 345/156 |
| 6,641,054 B2 | 11/2003 | Morey |
| 6,641,055 B1 | 11/2003 | Tiernan |
| 6,643,567 B2 | 11/2003 | Kolk et al. |
| 6,644,557 B1 | 11/2003 | Jacobs |
| 6,645,066 B2 | 11/2003 | Gutta et al. |
| D485,279 S | 1/2004 | DeCombe |
| 6,726,112 B1 | 4/2004 | Ho |
| D491,956 S | 6/2004 | Ombao et al. |
| 6,769,482 B2 | 8/2004 | Wagner et al. |
| 6,785,630 B2 | 8/2004 | Kolk et al. |
| 6,798,341 B1 | 9/2004 | Eckel et al. |
| D497,617 S | 10/2004 | Decombe et al. |
| 6,814,299 B1 | 11/2004 | Carey |
| 6,824,069 B2 | 11/2004 | Rosen |
| 6,851,621 B1 | 2/2005 | Wacker et al. |
| 6,864,879 B2 * | 3/2005 | Nojima et al. ................ 345/156 |
| D503,631 S | 4/2005 | Peabody |
| 6,891,838 B1 | 5/2005 | Petite et al. |
| 6,909,921 B1 | 6/2005 | Bilger |
| 6,951,306 B2 | 10/2005 | DeLuca |
| D511,527 S | 11/2005 | Hernandez et al. |
| 6,975,958 B2 | 12/2005 | Bohrer et al. |
| 6,990,821 B2 | 1/2006 | Singh et al. |
| 7,000,849 B2 | 2/2006 | Ashworth et al. |
| 7,024,336 B2 | 4/2006 | Salsbury et al. |
| 7,028,912 B1 | 4/2006 | Rosen |
| 7,035,805 B1 | 4/2006 | Miller |
| 7,038,667 B1 | 5/2006 | Vassallo et al. |
| 7,055,759 B2 | 6/2006 | Wacker et al. |
| 7,083,109 B2 | 8/2006 | Pouchak |
| 7,108,194 B1 | 9/2006 | Hankins, II |

(56) References Cited

U.S. PATENT DOCUMENTS

| | | |
|---|---|---|
| 7,109,970 B1 | 9/2006 | Miller |
| 7,111,788 B2 | 9/2006 | Reponen |
| 7,114,554 B2 | 10/2006 | Bergman et al. |
| 7,135,965 B2 | 11/2006 | Chapman, Jr. et al. |
| 7,140,551 B2 | 11/2006 | de Pauw et al. |
| 7,141,748 B2 | 11/2006 | Tanaka et al. |
| 7,142,948 B2 | 11/2006 | Metz |
| 7,149,729 B2 | 12/2006 | Kaasten et al. |
| 7,152,806 B1 | 12/2006 | Rosen |
| 7,156,318 B1 | 1/2007 | Rosen |
| 7,159,789 B2 | 1/2007 | Schwendinger et al. |
| 7,159,790 B2 | 1/2007 | Schwendinger et al. |
| 7,181,317 B2 | 2/2007 | Amundson et al. |
| 7,188,482 B2 | 3/2007 | Sadegh et al. |
| 7,222,494 B2 | 5/2007 | Peterson et al. |
| 7,222,800 B2 | 5/2007 | Wruck |
| 7,225,054 B2 | 5/2007 | Amundson et al. |
| D544,877 S | 6/2007 | Sasser |
| 7,258,280 B2 | 8/2007 | Wolfson |
| D550,691 S | 9/2007 | Hally et al. |
| 7,264,175 B2 | 9/2007 | Schwendinger et al. |
| 7,274,972 B2 | 9/2007 | Amundson et al. |
| 7,287,709 B2 | 10/2007 | Proffitt et al. |
| 7,289,887 B2 | 10/2007 | Rodgers |
| 7,299,996 B2 | 11/2007 | Garrett et al. |
| 7,302,642 B2 | 11/2007 | Smith et al. |
| 7,333,880 B2 | 2/2008 | Brewster et al. |
| 7,346,467 B2 | 3/2008 | Bohrer et al. |
| D566,587 S | 4/2008 | Rosen |
| 7,379,791 B2 | 5/2008 | Tamarkin et al. |
| RE40,437 E | 7/2008 | Rosen |
| 7,418,663 B2 | 8/2008 | Pettinati et al. |
| 7,427,926 B2 | 9/2008 | Sinclair et al. |
| 7,434,742 B2 | 10/2008 | Mueller et al. |
| 7,451,937 B2 | 11/2008 | Flood et al. |
| 7,455,240 B2 | 11/2008 | Chapman, Jr. et al. |
| 7,460,690 B2 | 12/2008 | Cohen et al. |
| 7,469,550 B2 | 12/2008 | Chapman, Jr. et al. |
| D588,152 S | 3/2009 | Okada |
| 7,509,753 B2 | 3/2009 | Nicosia et al. |
| D589,792 S | 4/2009 | Clabough et al. |
| D590,412 S | 4/2009 | Saft et al. |
| D593,120 S | 5/2009 | Bouchard et al. |
| 7,537,171 B2 | 5/2009 | Mueller et al. |
| D594,015 S | 6/2009 | Singh et al. |
| D595,309 S | 6/2009 | Sasaki et al. |
| 7,555,364 B2 | 6/2009 | Poth et al. |
| D596,194 S | 7/2009 | Vu et al. |
| D597,101 S | 7/2009 | Chaudhri et al. |
| 7,558,648 B2 | 7/2009 | Hoglund et al. |
| D598,463 S | 8/2009 | Hirsch et al. |
| 7,571,014 B1 | 8/2009 | Lambourne et al. |
| 7,571,865 B2 | 8/2009 | Nicodem et al. |
| 7,575,179 B2 | 8/2009 | Morrow et al. |
| D599,810 S | 9/2009 | Scalisi et al. |
| 7,584,899 B2 | 9/2009 | de Pauw et al. |
| 7,600,694 B2 | 10/2009 | Helt et al. |
| D603,277 S | 11/2009 | Clausen et al. |
| D603,421 S | 11/2009 | Ebeling et al. |
| D604,740 S | 11/2009 | Matheny et al. |
| 7,614,567 B2 | 11/2009 | Chapman, Jr. et al. |
| 7,620,996 B2 | 11/2009 | Torres et al. |
| D607,001 S | 12/2009 | Ording |
| 7,624,931 B2 | 12/2009 | Chapman, Jr. et al. |
| 7,634,504 B2 | 12/2009 | Amundson |
| 7,641,126 B2 | 1/2010 | Schultz et al. |
| 7,644,869 B2 | 1/2010 | Hoglund et al. |
| 7,667,163 B2 | 2/2010 | Ashworth et al. |
| D613,301 S | 4/2010 | Lee et al. |
| D614,194 S | 4/2010 | Guntaur et al. |
| D614,196 S | 4/2010 | Guntaur et al. |
| 7,693,582 B2 | 4/2010 | Bergman et al. |
| 7,702,424 B2 | 4/2010 | Cannon et al. |
| D703,694 S | 4/2010 | Mueller et al. |
| D614,976 S | 5/2010 | Skafdrup et al. |
| D615,546 S | 5/2010 | Lundy et al. |
| D616,460 S | 5/2010 | Pearson et al. |
| 7,721,209 B2 | 5/2010 | Tilton |
| 7,726,581 B2 | 6/2010 | Naujok et al. |
| D619,613 S | 7/2010 | Dunn |
| 7,784,704 B2 | 8/2010 | Harter |
| 7,802,618 B2 | 9/2010 | Simon et al. |
| D625,325 S | 10/2010 | Vu et al. |
| D625,734 S | 10/2010 | Kurozumi et al. |
| D626,133 S | 10/2010 | Murphy et al. |
| 7,823,076 B2 | 10/2010 | Borovsky et al. |
| RE41,922 E | 11/2010 | Gough et al. |
| 7,845,576 B2 | 12/2010 | Siddaramanna et al. |
| 7,848,900 B2 | 12/2010 | Steinberg et al. |
| 7,854,389 B2 | 12/2010 | Ahmed |
| D630,649 S | 1/2011 | Tokunaga et al. |
| 7,890,195 B2 | 2/2011 | Bergman et al. |
| 7,900,849 B2 | 3/2011 | Barton et al. |
| 7,904,209 B2 | 3/2011 | Podgorny et al. |
| 7,904,830 B2 | 3/2011 | Hoglund et al. |
| 7,908,116 B2 | 3/2011 | Steinberg et al. |
| 7,908,117 B2 | 3/2011 | Steinberg et al. |
| 7,913,925 B2 | 3/2011 | Ashworth |
| D638,835 S | 5/2011 | Akana et al. |
| D640,269 S | 6/2011 | Chen |
| D640,273 S | 6/2011 | Arnold et al. |
| D640,278 S | 6/2011 | Woo |
| D640,285 S | 6/2011 | Woo |
| D641,373 S | 7/2011 | Gardner et al. |
| 7,984,384 B2 | 7/2011 | Chaudhri et al. |
| D643,045 S | 8/2011 | Woo |
| 8,010,237 B2 | 8/2011 | Cheung et al. |
| 8,019,567 B2 | 9/2011 | Steinberg et al. |
| 8,037,022 B2 | 10/2011 | Rahman et al. |
| D648,735 S | 11/2011 | Arnold et al. |
| D651,529 S | 1/2012 | Mongell et al. |
| 8,090,477 B1 | 1/2012 | Steinberg |
| 8,091,375 B2 | 1/2012 | Crawford |
| 8,091,794 B2 | 1/2012 | Siddaramanna et al. |
| 8,131,207 B2 | 3/2012 | Hwang et al. |
| 8,131,497 B2 | 3/2012 | Steinberg et al. |
| 8,131,506 B2 | 3/2012 | Steinberg et al. |
| 8,136,052 B2 | 3/2012 | Shin et al. |
| D656,950 S | 4/2012 | Shallcross et al. |
| D656,952 S | 4/2012 | Weir et al. |
| 8,156,060 B2 | 4/2012 | Borzestowski et al. |
| 8,166,395 B2 | 4/2012 | Omi et al. |
| D658,674 S | 5/2012 | Shallcross et al. |
| 8,180,492 B2 | 5/2012 | Steinberg |
| 8,185,164 B2 | 5/2012 | Kim |
| 8,195,313 B1 | 6/2012 | Fadell et al. |
| D663,743 S | 7/2012 | Tanghe et al. |
| D663,744 S | 7/2012 | Tanghe et al. |
| D664,559 S | 7/2012 | Ismail et al. |
| 8,219,249 B2 | 7/2012 | Harrod et al. |
| 8,223,134 B1 | 7/2012 | Forstall et al. |
| 8,234,581 B2 | 7/2012 | Kake |
| D664,978 S | 8/2012 | Tanghe et al. |
| D665,397 S | 8/2012 | Naranjo et al. |
| 8,243,017 B2 | 8/2012 | Brodersen et al. |
| 8,253,704 B2 | 8/2012 | Jang |
| 8,253,747 B2 | 8/2012 | Niles et al. |
| 8,280,536 B1 | 10/2012 | Fadell et al. |
| 8,281,244 B2 | 10/2012 | Neuman et al. |
| D671,136 S | 11/2012 | Barnett et al. |
| 8,316,022 B2 | 11/2012 | Matsuda et al. |
| D673,171 S | 12/2012 | Peters et al. |
| D673,172 S | 12/2012 | Peters et al. |
| 8,341,557 B2 | 12/2012 | Pisula et al. |
| 8,442,695 B2 | 5/2013 | Imes et al. |
| 2001/0052052 A1 | 12/2001 | Peng |
| 2002/0005435 A1 | 1/2002 | Cottrell |
| 2002/0022991 A1 | 2/2002 | Sharood et al. |
| 2003/0034898 A1 | 2/2003 | Shamoon et al. |
| 2003/0042320 A1 | 3/2003 | Decker |
| 2003/0112262 A1 | 6/2003 | Adatia et al. |
| 2003/0231001 A1 | 12/2003 | Bruning |
| 2004/0015504 A1 | 1/2004 | Ahad et al. |
| 2004/0034484 A1 | 2/2004 | Solomita, Jr. et al. |

(56) References Cited

U.S. PATENT DOCUMENTS

| | | |
|---|---|---|
| 2004/0055446 A1 | 3/2004 | Robbin et al. |
| 2004/0067731 A1 | 4/2004 | Brinkerhoff et al. |
| 2004/0074978 A1 | 4/2004 | Rosen |
| 2004/0095237 A1 | 5/2004 | Chen et al. |
| 2004/0164238 A1 | 8/2004 | Xu et al. |
| 2004/0249479 A1 | 12/2004 | Shorrock |
| 2004/0256472 A1 | 12/2004 | DeLuca |
| 2004/0260427 A1 | 12/2004 | Wimsatt |
| 2004/0262410 A1 | 12/2004 | Hull |
| 2005/0040250 A1 | 2/2005 | Wruck |
| 2005/0043907 A1 | 2/2005 | Eckel et al. |
| 2005/0055432 A1 | 3/2005 | Rodgers |
| 2005/0071780 A1 | 3/2005 | Muller et al. |
| 2005/0090915 A1 | 4/2005 | Geiwitz |
| 2005/0103875 A1 | 5/2005 | Ashworth et al. |
| 2005/0119766 A1 | 6/2005 | Amundson et al. |
| 2005/0119793 A1 | 6/2005 | Amundson et al. |
| 2005/0120181 A1 | 6/2005 | Arunagirinathan et al. |
| 2005/0128067 A1 | 6/2005 | Zakrewski |
| 2005/0150968 A1 | 7/2005 | Shearer |
| 2005/0159847 A1 | 7/2005 | Shah et al. |
| 2005/0189429 A1 | 9/2005 | Breeden |
| 2005/0192915 A1 | 9/2005 | Ahmed et al. |
| 2005/0194456 A1 | 9/2005 | Tessier et al. |
| 2005/0199737 A1* | 9/2005 | de Pauw et al. ............. 236/94 |
| 2005/0204997 A1 | 9/2005 | Fournier |
| 2005/0279840 A1 | 12/2005 | Schwendinger et al. |
| 2005/0279841 A1* | 12/2005 | Schwendinger et al. ..... 236/1 C |
| 2005/0280421 A1 | 12/2005 | Yomoda et al. |
| 2006/0000919 A1 | 1/2006 | Schwendinger et al. |
| 2006/0186214 A1 | 8/2006 | Simon et al. |
| 2006/0196953 A1 | 9/2006 | Simon et al. |
| 2007/0001830 A1 | 1/2007 | Dagci et al. |
| 2007/0045430 A1 | 3/2007 | Chapman et al. |
| 2007/0045433 A1 | 3/2007 | Chapman et al. |
| 2007/0045444 A1 | 3/2007 | Gray et al. |
| 2007/0050732 A1 | 3/2007 | Chapman et al. |
| 2007/0057079 A1 | 3/2007 | Stark et al. |
| 2007/0084941 A1 | 4/2007 | de Pauw et al. |
| 2007/0114295 A1 | 5/2007 | Jenkins |
| 2007/0115902 A1 | 5/2007 | Shamoon et al. |
| 2007/0132503 A1 | 6/2007 | Nordin |
| 2007/0157639 A1 | 7/2007 | Harrod |
| 2007/0158442 A1 | 7/2007 | Chapman et al. |
| 2007/0158444 A1 | 7/2007 | Naujok et al. |
| 2007/0173978 A1 | 7/2007 | Fein et al. |
| 2007/0220907 A1 | 9/2007 | Ehlers |
| 2007/0221741 A1 | 9/2007 | Wagner et al. |
| 2007/0225867 A1 | 9/2007 | Moorer et al. |
| 2007/0227721 A1 | 10/2007 | Springer et al. |
| 2007/0228183 A1 | 10/2007 | Kennedy et al. |
| 2007/0241203 A1 | 10/2007 | Wagner et al. |
| 2007/0246553 A1 | 10/2007 | Morrow et al. |
| 2007/0257120 A1 | 11/2007 | Chapman et al. |
| 2007/0278320 A1 | 12/2007 | Lunacek et al. |
| 2007/0296280 A1 | 12/2007 | Sorg et al. |
| 2008/0006709 A1 | 1/2008 | Ashworth et al. |
| 2008/0015740 A1 | 1/2008 | Osann |
| 2008/0015742 A1 | 1/2008 | Kulyk et al. |
| 2008/0048046 A1 | 2/2008 | Wagner et al. |
| 2008/0054082 A1 | 3/2008 | Evans et al. |
| 2008/0099568 A1 | 5/2008 | Nicodem et al. |
| 2008/0155915 A1 | 7/2008 | Howe et al. |
| 2008/0191045 A1 | 8/2008 | Harter |
| 2008/0215240 A1 | 9/2008 | Howard et al. |
| 2008/0221737 A1 | 9/2008 | Josephson et al. |
| 2008/0245480 A1 | 10/2008 | Knight et al. |
| 2008/0273754 A1 | 11/2008 | Hick et al. |
| 2008/0290183 A1 | 11/2008 | Laberge et al. |
| 2008/0317292 A1 | 12/2008 | Baker et al. |
| 2009/0001180 A1 | 1/2009 | Siddaramanna et al. |
| 2009/0001181 A1 | 1/2009 | Siddaramanna et al. |
| 2009/0099699 A1 | 4/2009 | Steinberg et al. |
| 2009/0125151 A1 | 5/2009 | Steinberg et al. |
| 2009/0127078 A1 | 5/2009 | Hostmann et al. |
| 2009/0140056 A1 | 6/2009 | Leen |
| 2009/0140057 A1 | 6/2009 | Leen |
| 2009/0140060 A1 | 6/2009 | Stoner et al. |
| 2009/0140064 A1 | 6/2009 | Schultz et al. |
| 2009/0143916 A1 | 6/2009 | Boll et al. |
| 2009/0143918 A1 | 6/2009 | Amundson et al. |
| 2009/0171862 A1 | 7/2009 | Harrod et al. |
| 2009/0194601 A1 | 8/2009 | Flohr |
| 2009/0254225 A1 | 10/2009 | Boucher et al. |
| 2009/0259713 A1 | 10/2009 | Blumrich et al. |
| 2009/0261174 A1 | 10/2009 | Butler et al. |
| 2009/0263773 A1 | 10/2009 | Kotlyar et al. |
| 2009/0273610 A1 | 11/2009 | Busch et al. |
| 2009/0283603 A1 | 11/2009 | Peterson et al. |
| 2009/0297901 A1 | 12/2009 | Kilian et al. |
| 2009/0327354 A1 | 12/2009 | Resnick et al. |
| 2010/0019051 A1 | 1/2010 | Rosen |
| 2010/0025483 A1 | 2/2010 | Hoeynck et al. |
| 2010/0050004 A1 | 2/2010 | Hamilton, II et al. |
| 2010/0053464 A1* | 3/2010 | Otsuka .................... 348/734 |
| 2010/0070084 A1 | 3/2010 | Steinberg et al. |
| 2010/0070085 A1 | 3/2010 | Harrod et al. |
| 2010/0070086 A1 | 3/2010 | Harrod et al. |
| 2010/0070089 A1 | 3/2010 | Harrod et al. |
| 2010/0070093 A1 | 3/2010 | Harrod et al. |
| 2010/0070234 A1 | 3/2010 | Steinberg et al. |
| 2010/0070907 A1 | 3/2010 | Harrod et al. |
| 2010/0076605 A1 | 3/2010 | Harrod et al. |
| 2010/0076835 A1 | 3/2010 | Silverman |
| 2010/0084482 A1 | 4/2010 | Kennedy et al. |
| 2010/0106305 A1 | 4/2010 | Pavlak et al. |
| 2010/0107070 A1 | 4/2010 | Devineni et al. |
| 2010/0107076 A1 | 4/2010 | Grohman et al. |
| 2010/0107103 A1 | 4/2010 | Wallaert et al. |
| 2010/0163633 A1 | 7/2010 | Barrett et al. |
| 2010/0167783 A1 | 7/2010 | Alameh et al. |
| 2010/0168924 A1 | 7/2010 | Tessier et al. |
| 2010/0179704 A1 | 7/2010 | Ozog |
| 2010/0198425 A1 | 8/2010 | Donovan |
| 2010/0211224 A1 | 8/2010 | Keeling et al. |
| 2010/0230510 A1 | 9/2010 | Wilson |
| 2010/0262298 A1 | 10/2010 | Johnson et al. |
| 2010/0262299 A1 | 10/2010 | Cheung et al. |
| 2010/0280667 A1 | 11/2010 | Steinberg |
| 2010/0282857 A1 | 11/2010 | Steinberg |
| 2010/0289643 A1 | 11/2010 | Trundle et al. |
| 2010/0308119 A1 | 12/2010 | Steinberg et al. |
| 2010/0318227 A1 | 12/2010 | Steinberg et al. |
| 2011/0001812 A1 | 1/2011 | Kang et al. |
| 2011/0015797 A1 | 1/2011 | Gilstrap |
| 2011/0015798 A1 | 1/2011 | Golden et al. |
| 2011/0015802 A1 | 1/2011 | Imes |
| 2011/0016017 A1 | 1/2011 | Carlin et al. |
| 2011/0022242 A1 | 1/2011 | Bukhin et al. |
| 2011/0046756 A1 | 2/2011 | Park |
| 2011/0046792 A1 | 2/2011 | Imes et al. |
| 2011/0046805 A1 | 2/2011 | Bedros et al. |
| 2011/0046806 A1 | 2/2011 | Nagel et al. |
| 2011/0054710 A1 | 3/2011 | Imes et al. |
| 2011/0077758 A1 | 3/2011 | Tran et al. |
| 2011/0077896 A1 | 3/2011 | Steinberg et al. |
| 2011/0082594 A1 | 4/2011 | Dage et al. |
| 2011/0106328 A1 | 5/2011 | Zhou et al. |
| 2011/0147102 A1 | 6/2011 | Song et al. |
| 2011/0151837 A1 | 6/2011 | Winbush, III |
| 2011/0160913 A1 | 6/2011 | Parker et al. |
| 2011/0166828 A1 | 7/2011 | Steinberg et al. |
| 2011/0167369 A1 | 7/2011 | van Os |
| 2011/0185895 A1 | 8/2011 | Freen |
| 2011/0290893 A1 | 12/2011 | Steinberg |
| 2011/0307103 A1 | 12/2011 | Cheung et al. |
| 2011/0307112 A1 | 12/2011 | Barrilleaux |
| 2012/0017611 A1 | 1/2012 | Coffel et al. |
| 2012/0036250 A1 | 2/2012 | Vaswani et al. |
| 2012/0053745 A1 | 3/2012 | Ng |
| 2012/0065935 A1 | 3/2012 | Steinberg et al. |
| 2012/0085831 A1 | 4/2012 | Kopp |
| 2012/0086562 A1 | 4/2012 | Steinberg |
| 2012/0089523 A1 | 4/2012 | Hurri et al. |

(56) References Cited

U.S. PATENT DOCUMENTS

| | | | |
|---|---|---|---|
| 2012/0130546 A1* | 5/2012 | Matas et al. | 700/276 |
| 2012/0130547 A1 | 5/2012 | Fadell et al. | |
| 2012/0131504 A1 | 5/2012 | Fadell et al. | |
| 2012/0158350 A1 | 6/2012 | Steinberg et al. | |
| 2012/0179300 A1 | 7/2012 | Warren et al. | |
| 2012/0203379 A1 | 8/2012 | Sloo et al. | |
| 2012/0221151 A1 | 8/2012 | Steinberg | |
| 2012/0239207 A1 | 9/2012 | Fadell et al. | |
| 2013/0024799 A1 | 1/2013 | Fadell et al. | |
| 2013/0090767 A1 | 4/2013 | Bruck et al. | |
| 2013/0099011 A1 | 4/2013 | Matsuoka et al. | |
| 2014/0346241 A1 | 11/2014 | Fadell et al. | |

FOREIGN PATENT DOCUMENTS

| | | |
|---|---|---|
| EP | 207295 | 1/1987 |
| EP | 0 434 926 A2 | 7/1991 |
| EP | 196069 | 12/1991 |
| EP | 0 720 077 A2 | 7/1996 |
| EP | 0 802 471 B1 | 8/1999 |
| EP | 1 065 079 A2 | 1/2001 |
| EP | 1 731 984 A1 | 12/2006 |
| EP | 1283396 | 3/2007 |
| EP | 2 157 492 A2 | 2/2010 |
| EP | 1703356 | 9/2011 |
| GB | 2 212 317 B | 5/1992 |
| JP | 59-106311 A | 6/1984 |
| JP | 01252850 | 10/1989 |
| JP | 09298780 | 11/1997 |
| JP | 10023565 | 1/1998 |
| JP | 2002-087050 A | 3/2002 |
| JP | 2003-054290 A | 2/2003 |
| KR | 1020070117874 | 12/2007 |
| NL | 1024986 C2 | 6/2005 |
| WO | 02/48851 A2 | 6/2002 |
| WO | 2005019740 | 3/2005 |
| WO | 2008054938 | 5/2008 |
| WO | 2009/073496 A2 | 6/2009 |
| WO | 2010033563 | 3/2010 |
| WO | 2011/128416 A2 | 10/2011 |
| WO | 2011149600 | 12/2011 |
| WO | 2012024534 | 2/2012 |
| WO | 2013059671 | 4/2013 |

OTHER PUBLICATIONS

Honeywell CT2700, An Electronic Round Programmable Thermostat—User's Guide, Honeywell, Inc., 1997, 8 pages.

Honeywell CT8775A,C, The digital Round Non-Programmable Thermostats—Owner's Guide, Honeywell International Inc., 2003, 20 pages.

Honeywell T8700C, An Electronic Round Programmable Thermostat—Owner's Guide, Honeywell, Inc., 1997, 12 pages.

Honeywell T8775 The Digital Round Thermostat, Honeywell, 2003, 2 pages.

Honeywell T8775AC Digital Round Thermostat Manual No. 69-1679EF-1, www.honeywell.com/yourhome, Jun. 2004, pp. 1-16.

ICY 3815TT-001 Timer-Thermostat Package Box, ICY BV Product Bar Code No. 8717953007902, 2009, 2 pages.

Introducing the New Smart Si Thermostat. Datasheet [online]. Ecobee, No Date Given [retrieved on Feb. 25, 2013]. Retrieved from the Internet: <URL: https://www.ecobee.com/solutions/home/smart-si/>.

The Clever Thermostat, ICY BV Web Page, http://www.icy.nl/en/consumer/products/clever-thermostat, 2012 ICY BV, 1 page.

The Clever Thermostat User Manual and Installation Guide, ICY BV ICY3815 Timer-Thermostat, 2009, pp. 1-36.

U.S. Appl. No. 60/512,886, Volkswagen Rotary Knob for Motor Vehicle—English Translation of German Application filed Oct. 20, 2003.

Arens, et al., Demand Response Electrical Appliance Manager—User Interface Design, Development and Testing, Poster, Demand Response Enabling Technology Development, University of California Berkeley, Retrieved from dr.berkeley.edu/dream/posters/2005_6GUIposter.pdf, 2005, 1 page.

Arens, et al., Demand Response Enabled Thermostat—Control Strategies and Interface, Demand Response Enabling Technology Development Poster, University of California Berkeley, Retrieved from dr.berkeley.edu/dream/posters/2004_11CEC_TstatPoster.pdf, 2004, 1 page.

Arens, et al., Demand Response Enabling Technology Development, Phase I Report: Jun. 2003-Nov. 2005, Jul. 27, P:/DemandRes/UC Papers/DR-Phase1Report-Final DraftApril24-26.doc, University of California Berkeley, Apr. 4, 2006, pp. 1-108.

Arens, et al., New Thermostat Demand Response Enabling Technology, Poster, University of California Berkeley, Jun. 10, 2004.

Auslander, et al., UC Berkeley DR Research Energy Management Group, Power Point Presentation, DR ETD Workshop, State of California Energy Commission, Jun. 11, 2007, pp. 1-35.

Chen, et al., Demand Response-Enabled Residential Thermostat Controls, Abstract, ACEEE Summer Study on Energy Efficiency in Buildings, Mechanical Engineering Dept. and Architecture Dept., University of California Berkeley. 2008, pp. 1-24 through 1-36.

Green, Thermo Heat Tech Cool, Popular Mechanics Electronic Thermostat Guide, Oct. 1985, pp. 155-158.

Meier, et al., Thermostat Interface Usability: A Survey, Ernest Orlando Lawrence Berkeley National Laboratory, Environmental Energy Technologies Division, Berkeley California, Sep. 2010, pp. 1-73.

International Application No. PCT/US2012/056766, International Search Report and Written Opinion mailed on Dec. 6, 2012, 14 Pages.

Peffer, et al., A Tale of Two Houses: The Human Dimension of Demand Response Enabling Technology from a Case Study of Adaptive Wireless Thermostat, Abstract, ACEEE Summer Study on Energy Efficiency in Buildings, Architecture Dept. and Mechanical Engineering Dept., University of California Berkeley, 2008, pp. 7-242 through 7-253.

Peffer, et al., Smart Comfort At Home: Design of a Residential Thermostat to Achieve Thermal Comfort, and Save Money and Peak Energy, University of California Berkeley, Mar. 2007.

Salus, S-Series Digital Thermostat Instruction Manual-ST620 Model No. Instruction Manual, www.salus-tech.com, Version 005, Apr. 29, 2010, 24 pages.

Sanford, iPod (Click Wheel) (2004), www.apple-history.com [retrieved on Apr. 9, 2012]. Retrieved from: http://apple-history.com/ipod, Apr. 9, 2012, 2 pages.

Wright, et al., DR ETD—Summary of New Thermostat, TempNode & New Meter (UC Berkeley Project), Power Point Presentation, Public Interest Energy Research, University of California Berkeley. Retrieved from: http://dr.berkeley.edu/dream/presentations/2005_6CEC.pdf, 2005, pp. 1-49.

International Preliminary Report on Patentability mailed Apr. 22, 2014 for International Patent Application No. PCT/US2012/056766 filed Sep. 22, 2012, 10 pages.

Advanced Model Owner's Manual, Bay Web Thermostat, manual [online], [retrieved on Nov. 7, 2012]. Retrieved from the Internet: <URL:http://www.bayweb.com/wp-content/uploads/BW-WT4-2DOC.pdf>, Oct. 6, 2011, 31 pages.

Aprilaire Electronic Thermostats Model 8355 User's Manual, Research Products Corporation, Dec., 2000, 16 pages.

Braeburn 5300 Installer Guide, Braeburn Systems, LLC, Dec. 9, 2009, 10 pages.

Braeburn Model 5200, Braeburn Systems, LLC, Jul. 20, 2011, 11 pages.

Ecobee Smart Si Thermostat Installation Manual, Ecobee, Apr. 3, 2012, 40 pages.

Ecobee Smart Si Thermostat User Manual, Ecobee, Apr. 3, 2012, 44 pages.

Ecobee Smart Thermostat Installation Manual, Jun. 29, 2011, 20 pages.

Ecobee Smart Thermostat User Manual, May 11, 2010, 20 pages.

Electric Heat Lock Out on Heat Pumps, Washington State University Extension Energy Program, Apr. 2010, pp. 1-3.

Honeywell Installation Guide FocusPRO TH6000 Series, Honeywell International, Inc., Jan. 5, 2012, 24 pages.

(56) References Cited

OTHER PUBLICATIONS

Honeywell Operating Manual FocusPRO TH6000 Series, Honeywell International, Inc., Mar. 25, 2011, 80 pages.
Honeywell Prestige IAQ Product Data 2, Honeywell International, Inc., Jan. 12, 2012, 126 pages.
Honeywell Prestige THX9321 and TXH9421 Product Data, Honeywell International, Inc., 68-0311, Jan. 2012, 126 pages.
Honeywell Prestige THX9321-9421 Operating Manual, Honeywell International, Inc., Jul. 6, 2011, 120 pages.
Hunter Internet Thermostat Installation Guide, Hunter Fan Co., Aug. 14, 2012, 8 pages.
Lennox ComfortSense 5000 Owners Guide, Lennox Industries, Inc., Feb. 2008, 32 pages.
Lennox ComfortSense 7000 Owners Guide, Lennox Industries, Inc., May, 2009, 15 pages.
Lennox iComfort Manual, Lennox Industries, Inc., Dec. 2010, 20 pages.
Lux PSPU732T Manual, Lux Products Corporation, Jan. 6, 2009, 48 pages.
NetX RP32-WIFI Network Thermostat Consumer Brochure, Network Thermostat, May, 2011, 2 pages.
NetX RP32-WIFI Network Thermostat Specification Sheet, Network Thermostat, Feb. 28, 2012, 2 pages.
RobertShaw Product Manual 9620, Maple Chase Company, Jun. 12, 2001, 14 pages.
RobertShaw Product Manual 9825i2, Maple Chase Company, Jul. 17, 2006, 36 pages.
SCE Energy$mart Thermostat Study for Southern California Edison—Presentation of Study Results, Population Research Systems, Project #1010, Nov. 10, 2004, 51 pages.
SYSTXCCUIZ01-V Infinity Control Installation Instructions, Carrier Corp, May 31, 2012, 20 pages.
T8611G Chronotherm IV Deluxe Programmable Heat Pump Thermostat Product Data, Honeywell International Inc., Oct. 1997, 24 pages.
TB-PAC, TB-PHP, Base Series Programmable Thermostats, Carrier Corp, May 14, 2012, 8 pages.
The Perfect Climate Comfort Center PC8900A W8900A-C Product Data Sheet, Honeywell International Inc, Apr. 2001, 44 pages.
TP-PAC, TP-PHP, TP-NAC, TP-NHP Performance Series AC/HP Thermostat Installation Instructions, Carrier Corp, Sep. 2007, 56 pages.
Trane Communicating Thermostats for Fan Coil, Trane, May 2011, 32 pages.
Trane Communicating Thermostats for Heat Pump Control, Trane, May 2011, 32 pages.
Trane Install XL600 Installation Manual, Trane, Mar. 2006, 16 pages.
Trane XL950 Installation Guide, Trane, Mar. 2011, 20 pages.
Venstar T2900 Manual, Venstar, Inc., Apr. 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat, Honeywell International, Inc. Operating Manual, Aug. 2012, 48 pages.
White Rodgers (Emerson) Model 1F81-261 Installation and Operating Instructions, White Rodgers, Apr. 15, 2010, 8 pages.
White Rodgers (Emerson) Model IF98EZ-1621 Homeowner's User Guide, White Rodgers, Jan. 25, 2012, 28 pages.
Allen, et al., "Real-Time Earthquake Detection and Hazard Assessment by ElarmS Across California", Geophysical Research Letters, vol. 36, L00B08, 2009, pp. 1-6.
Bourke, Server Load Balancing, O'Reilly & Associates, Inc., Aug. 2001, 182 pages.
De Almeida, et al., "Advanced Monitoring Technologies for the Evaluation of Demand-Side Management Programs", Energy, vol. 19, No. 6, 1994, pp. 661-678.
Deleeuw, "Ecobee WiFi Enabled Smart Thermostat Part 2: The Features Review", Retrieved from <URL: http://www.homenetworkenabled.com/content.php?136-ecobee-WiFi-enabled-Smart-Thermostat-Part-2-The-Features-review>, Dec. 2, 2011, 5 pages.
Gao, et al., "The Self-Programming Thermostat: Optimizing Setback Schedules Based on Home Occupancy Patterns", In Proceedings of the First ACM Workshop on Embedded Sensing Systems for Energy-Efficiency in Buildings, Nov. 3, 2009, 6 pages.
Gevorkian, "Alternative Energy Systems in Building Design", 2009, pp. 195-200.
Hoffman, et al., "Integration of Remote Meter Reading, Load Control and Monitoring of Customers' Installations for Customer Automation with Telephone Line Signaling", Electricity Distribution, 1989. CIRED 1989. 10th International Conference on, May 8-12, 1989, pp. 421-424.
Levy, "A Vision of Demand Response—2016", The Electricity Journal, vol. 19, Issue 8, Oct. 2006, pp. 12-23.
Loisos, et al., "Buildings End-Use Energy Efficiency: Alternatives to Compressor Cooling", California Energy Commission, Public Interest Energy Research, Jan. 2000, 80 pages.
Lopes, "Case Studies in Advanced Thermostat Control for Demand Response", AEIC Load Research Conference, St. Louis, MO, Jul. 2004, 36 pages.
Lu, et al., "The Smart Thermostat: Using Occupancy Sensors to Save Energy in Homes", In Proceedings of the 8th ACM Conference on Embedded Networked Sensor Systems, Nov. 3-5, 2010, pp. 211-224.
Martinez, "SCE Energy$mart Thermostat Program", Advanced Load Control Alliance, Oct. 5, 2004, 20 pages.
Matty, "Advanced Energy Management for Home Use", IEEE Transaction on Consumer Electronics, vol. 35, No. 3, Aug. 1989, pp. 584-588.
Motegi, et al., "Introduction to Commercial Building Control Strategies and Techniques for Demand Response", Demand Response Research Center, May 22, 2007, 35 pages.
Mozer, "The Neural Network House: An Environmental that Adapts to its Inhabitants", AAAI Technical Report SS-98-02, 1998, pp. 110-114.
White, et al., "A Conceptual Model for Simulation Load Balancing", Proc. 1998 Spring Simulation Interoperability Workshop, 1998, 7 pages.

\* cited by examiner

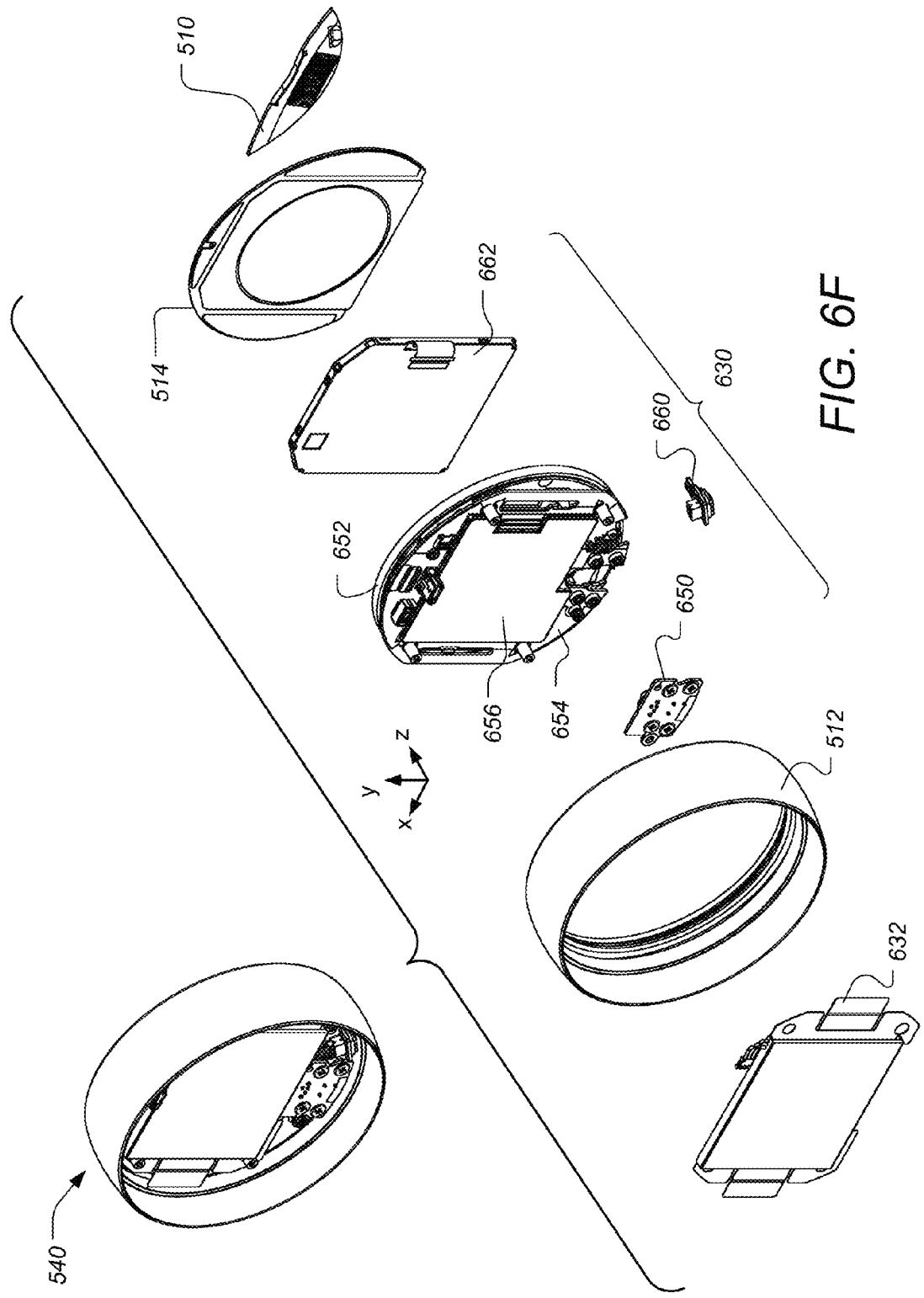

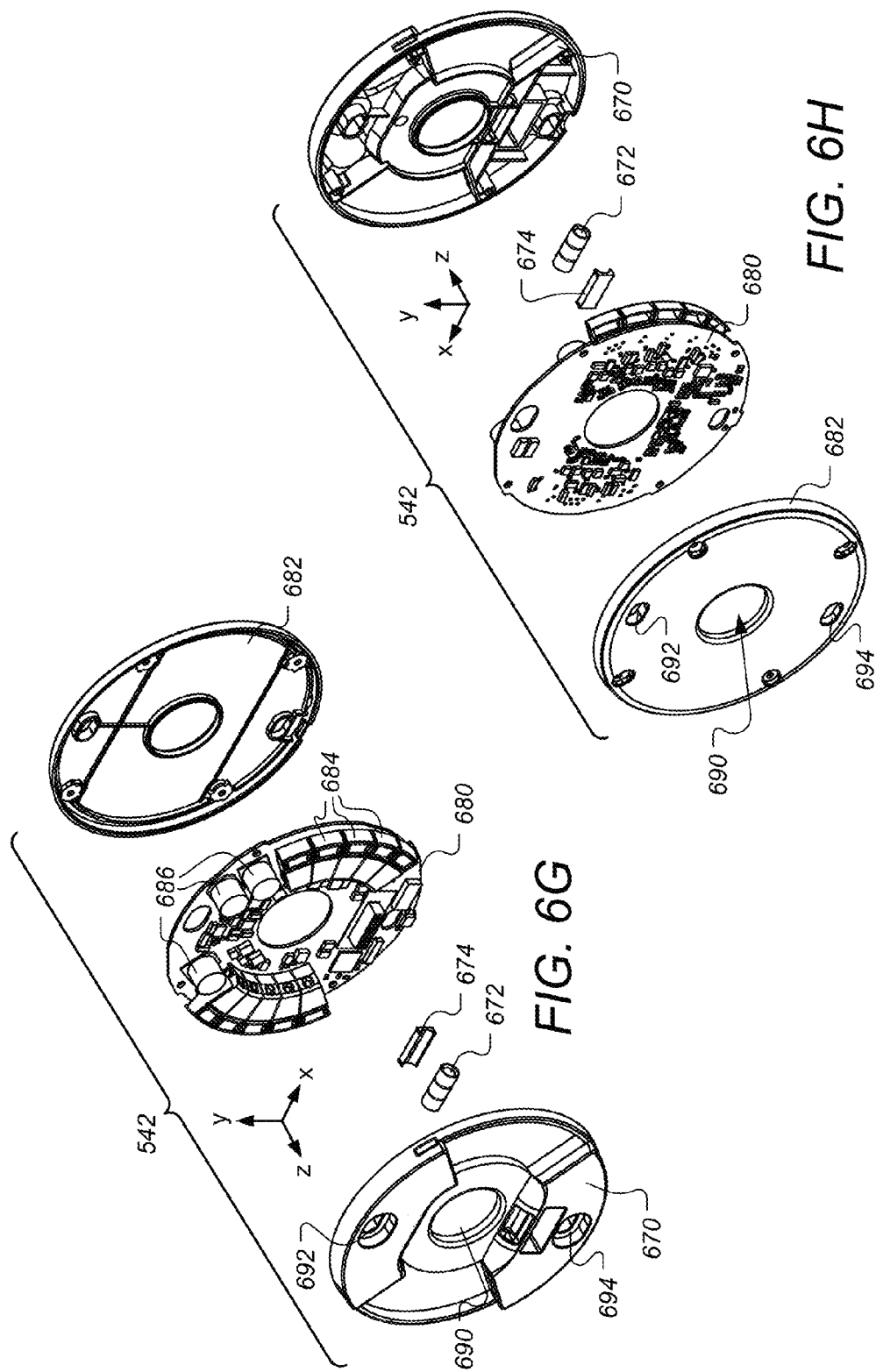

THERMOSTAT WITH RING-SHAPED CONTROL MEMBER

This application is a continuation of U.S. patent application Ser. No. 13/033,573, filed Feb. 23, 2011, which claims priority to U.S. Prov. Ser. No. 61/429,093, filed Dec. 31, 2010 and U.S. Prov. Ser. No. 61/415,771, filed Nov. 19, 2010. This application also claims the benefit of the commonly assigned U.S. Prov. Ser. No. 61/627,996 filed Oct. 21, 2011, which is incorporated by reference herein.

FIELD

This patent specification relates to systems, methods, and related computer program products for the monitoring and control of energy-consuming systems or other resource-consuming systems. More particularly, this patent specification relates to a low-profile wall-mountable thermostat having ring-shaped control member surrounding a rounded display.

BACKGROUND

In designing a visually pleasing wall-mounted thermostat, it is desirable to have a thermostat that has a sleek profile that does not protrude far from the wall. For enhancing user interface function and accuracy, it is also desirable for a rotating ring to have a high degree of sensing accuracy of rotational movement. For example accuracy of rotational movement is important so that the user can accurately user the rotating ring for adjusting setting setpoint temperatures and times, navigating menus and selecting options.

It is to be appreciated that although exemplary embodiments are presented herein for the particular context of HVAC system control, there are a wide variety of other resource usage contexts for which the embodiments are readily applicable including, but not limited to, water usage, air usage, the usage of other natural resources, and the usage of other (i.e., non-HVAC-related) forms of energy, as would be apparent to the skilled artisan in view of the present disclosure. Therefore, such application of the embodiments in such other resource usage contexts is not outside the scope of the present teachings.

SUMMARY

According to one or more embodiments thermostat for controlling an HVAC system is described. The thermostat includes: a housing; a processing system disposed with in the housing; a rounded electronic display coupled to the processing system and mounted on the housing and adapted to display information to a user; a ring-shaped control member mounted on the housing so as to surround the rounded display and rotate about a central axis; and an optical sensor mounted within the housing and directed away from the central axis and toward a radially inward-facing surface of the ring-shaped control member, so as to detect optical signals indicating rotational movement of ring-shaped control member and generate electrical signals therefrom, and the processing system being adapted and configured to detect user input based on the electrical signals generated by the optical sensor.

According to some embodiments, the radially inward-facing surface of the ring-shaped control member is curved and is textured to enhance detection of optical signals indicating rotational movement. The thermostat housing can be adapted to be mounted on a wall, and preferably has a relatively low profile such that it does not protrude far from the wall. According to some embodiments, the ring-shaped control member is configured to be inwardly pressable by the user along a direction of the central axis, and together with the rotational movement represents the sole physical user inputs to the thermostat. According to some embodiments, the housing is generally disk-like in shape, said display is circular, and the ring-shaped control member generally makes up an outer lateral periphery of the disk-like shape.

According to some embodiments a method is described for control of an HVAC system by a thermostat. The thermostat includes a housing, a processing system disposed with in the housing, a rounded electronic display coupled to the processing system and mounted on the body and adapted to display information to a user, a ring-shaped control member mounted on the body so as to surround the rounded display and rotate about a central axis, and an optical sensor mounted within the body and directed away from the central axis and toward a radially inward-facing surface of the ring-shaped control member. The method includes: detecting optical signals using the optical sensor indicating rotational movement of the radially inward facing surface of the ring-shaped control member; generating electrical signals therefrom; detect user input using the processing system based on the electrical signals generated by the optical sensor; and displaying information to the user on the rounded electronic display in response to the detected user input.

It will be appreciated that these systems and methods are novel, as are applications thereof and many of the components, systems, methods and algorithms employed and included therein. It should be appreciated that embodiments of the presently described inventive body of work can be implemented in numerous ways, including as processes, apparatus, systems, devices, methods, computer readable media, computational algorithms, embedded or distributed software and/or as a combination thereof. Several illustrative embodiments are described below.

BRIEF DESCRIPTION OF THE DRAWINGS

The inventive body of work will be readily understood by referring to the following detailed description in conjunction with the accompanying drawings, in which:

FIGS. 6E-6F illustrate exploded front and rear perspective views, respectively, of a head unit frontal assembly with respect to its primary components, according to some embodiments;

FIGS. 6G-6H illustrate exploded front and rear perspective views, respectively, of a back plate unit with respect to its primary components, according to some embodiments;

DETAILED DESCRIPTION

Figure 1:
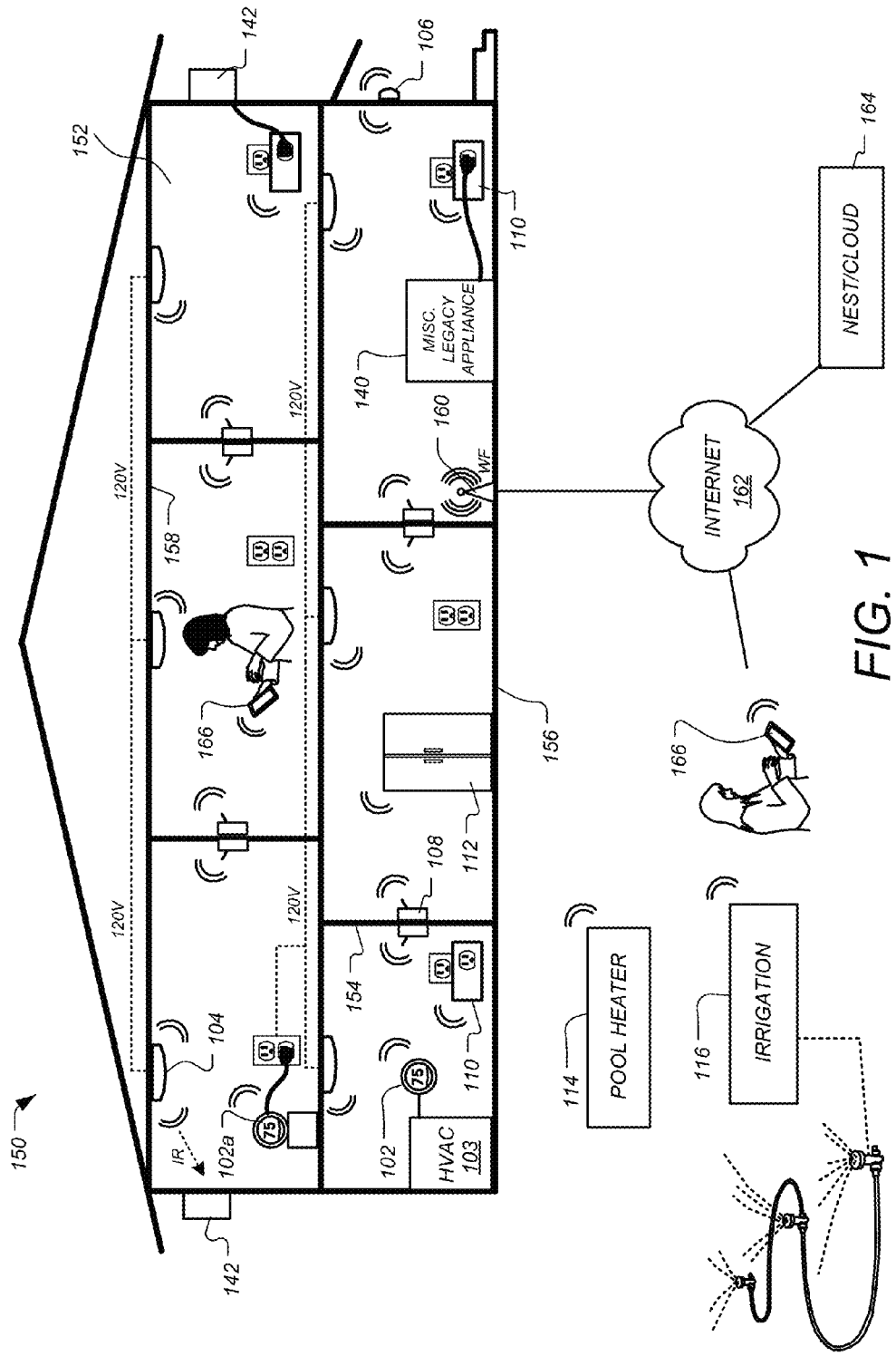
FIG. 1 illustrates an example of a smart home environment within which one or more of the devices, methods, systems, services, and/or computer program products described further herein can be applicable.

The subject matter of this patent specification relates to the subject matter of the following commonly assigned applications, each of which is incorporated by reference herein: U.S. Ser. No. 13/199,108 filed Aug. 17, 2011; U.S. Ser. No. 13/466,026 filed May 7, 2012; and International Application Ser. No. PCT/US12/00007 filed Jan. 3, 2012. The subject matter of this patent specification further relates to the subject matter of the commonly assigned U.S. Ser. No. 13/624,881, entitled "Integrating Sensing Systems Into Thermostat Housing In Manners Facilitating Compact And Visually Pleasing Physical Characteristics Thereof" filed even date herewith, which is incorporated by reference herein. The subject matter of this patent specification further relates to the subject matter of the commonly assigned U.S. Ser. No. 13/624,878, entitled "Thermostat With Wiring Terminals Configured for Spatial Compactness and Ease of Wire Installation" filed even date herewith, which is incorporated by reference herein. The above-referenced patent applications are collectively referenced herein as "the commonly assigned incorporated applications."

A detailed description of the inventive body of work is provided herein. While several embodiments are described, it should be understood that the inventive body of work is not limited to any one embodiment, but instead encompasses numerous alternatives, modifications, and equivalents. In addition, while numerous specific details are set forth in the following description in order to provide a thorough understanding of the inventive body of work, some embodiments can be practiced without some or all of these details. Moreover, for the purpose of clarity, certain technical material that is known in the related art has not been described in detail in order to avoid unnecessarily obscuring the inventive body of work.

As used herein the term "HVAC" includes systems providing both heating and cooling, heating only, cooling only, as well as systems that provide other occupant comfort and/or conditioning functionality such as humidification, dehumidification and ventilation.

As used herein the terms power "harvesting," "sharing" and "stealing" when referring to HVAC thermostats all refer to thermostats that are designed to derive power from the power transformer through the equipment load without using a direct or common wire source directly from the transformer.

As used herein the term "residential" when referring to an HVAC system means a type of HVAC system that is suitable to heat, cool and/or otherwise condition the interior of a building that is primarily used as a single family dwelling. An example of a cooling system that would be considered residential would have a cooling capacity of less than about 5 tons of refrigeration (1 ton of refrigeration=12,000 Btu/h).

As used herein the term "light commercial" when referring to an HVAC system means a type of HVAC system that is suitable to heat, cool and/or otherwise condition the interior of a building that is primarily used for commercial purposes, but is of a size and construction that a residential HVAC system is considered suitable. An example of a cooling system that would be considered residential would have a cooling capacity of less than about 5 tons of refrigeration.

As used herein the term "thermostat" means a device or system for regulating parameters such as temperature and/or humidity within at least a part of an enclosure. The term "thermostat" may include a control unit for a heating and/or cooling system or a component part of a heater or air conditioner. As used herein the term "thermostat" can also refer generally to a versatile sensing and control unit (VSCU unit) that is configured and adapted to provide sophisticated, customized, energy-saving HVAC control functionality while at the same time being visually appealing, non-intimidating, elegant to behold, and delightfully easy to use.

FIG. 1 illustrates an example of a smart home environment within which one or more of the devices, methods, systems, services, and/or computer program products described further herein can be applicable. The depicted smart home environment includes a structure 150, which can include, e.g., a house, office building, garage, or mobile home. It will be appreciated that devices can also be integrated into a smart home environment that does not include an entire structure 150, such as an apartment, condominium, or office space. Further, the smart home environment can control and/or be coupled to devices outside of the actual structure 150. Indeed, several devices in the smart home environment need not physically be within the structure 150 at all. For example, a device controlling a pool heater or irrigation system can be located outside of the structure 150.

The depicted structure 150 includes a plurality of rooms 152, separated at least partly from each other via walls 154. The walls 154 can include interior walls or exterior walls. Each room can further include a floor 156 and a ceiling 158. Devices can be mounted on, integrated with and/or supported by a wall 154, floor or ceiling.

The smart home depicted in FIG. 1 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 1.

An intelligent, multi-sensing, network-connected thermostat 102 can detect ambient climate characteristics (e.g., temperature and/or humidity) and control a heating, ventilation and air-conditioning (HVAC) system 103. One or more intelligent, network-connected, multi-sensing hazard detection units 104 can detect the presence of a hazardous substance and/or a hazardous condition in the home environment (e.g., smoke, fire, or carbon monoxide). One or more intelligent, multi-sensing, network-connected entryway interface devices 106, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 108 can detect ambient lighting conditions, detect room-occupancy states and control a power and/or dim state of one or more lights. In some instances, light switches 108 can further or alternatively control a power state or speed of a fan, such as a ceiling fan. Each of a plurality of intelligent, multi-sensing, network-connected wall plug interfaces 110 can detect occupancy of a room or enclosure and control supply of power to one or more wall plugs (e.g., such that power is not supplied to the plug if nobody is at home). The smart home may further include a plurality of intelligent, multi-sensing, network-connected appliances 112, such as refrigerators, stoves and/or ovens, televisions, washers, dryers, lights (inside and/or outside the structure 150), stereos, intercom systems, garage-door openers, floor fans, ceiling fans, whole-house fans, wall air conditioners, pool heaters 114, irrigation systems 116, security systems (including security system components such as cameras, motion detectors and window/door sensors), and so forth. While descriptions of FIG. 1 can identify specific sensors and functionalities associated with specific devices, it will be appreciated that any of a variety of sensors and functionalities (such as those described throughout the specification) can be integrated into the device.

In addition to containing processing and sensing capabilities, each of the devices 102, 104, 106, 108, 110, 112, 114 and 116 can be capable of data communications and information sharing with any other of the devices 102, 104, 106, 108, 110, 112, 114 and 116, as well as to any cloud server or any other device that is network-connected anywhere in the world. The devices can send and receive communications via any of a variety of custom or standard wireless protocols (Wi-Fi, ZigBee, 6LoWPAN, etc.) and/or any of a variety of custom or standard wired protocols (CAT6 Ethernet, HomePlug, etc.). The wall plug interfaces 110 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 160. A device can further communicate with remote devices via a connection to a network, such as the Internet 162. Through the Internet 162, the device can communicate with a central server or a cloud-computing system 164. The central server or cloud-computing system 164 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 164 to devices (e.g., when available, when purchased, or at routine intervals).

By virtue of network connectivity, one or more of the smart-home devices of FIG. 1 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 140, such as old conventional washer/dryers, refrigerators, and the like which can be controlled, albeit coarsely (ON/OFF), by virtue of the wall plug interfaces 110. The smart home can further include a variety of partially communicating legacy appliances 142, such as IR-controlled wall air conditioners or other IR-controlled devices, which can be controlled by IR signals provided by the hazard detection units 104 or the light switches 108.

Figure 2:
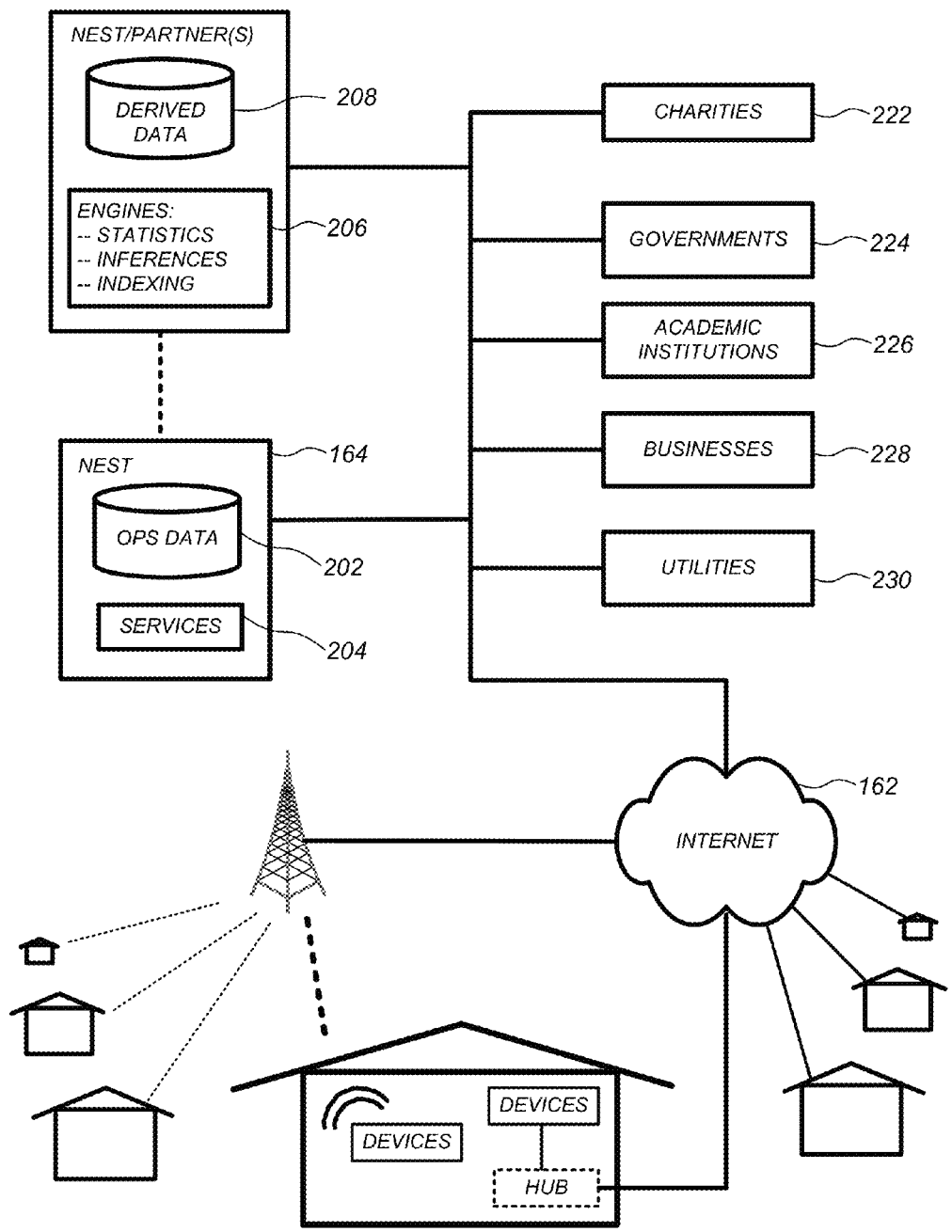
FIG. 2 illustrates a network-level view of an extensible devices and services platform with which the smart home of FIG. 1 can be integrated, according to some embodiments.

FIG. 2 illustrates a network-level view of an extensible devices and services platform with which the smart home of FIG. 1 can be integrated, according to some embodiments. Each of the intelligent, network-connected devices from FIG. 1 can communicate with one or more remote central servers or cloud computing systems 164. The communication can be enabled by establishing connection to the Internet 162 either directly (for example, using 3G/4G connectivity to a wireless carrier), though a hubbed network (which can be scheme ranging from a simple wireless router, for example, up to and including an intelligent, dedicated whole-home control node), or through any combination thereof.

The central server or cloud-computing system 164 can collect operation data 202 from the smart home devices. For example, the devices can routinely transmit operation data or can transmit operation data in specific instances (e.g., when requesting customer support). The central server or cloud-computing architecture 164 can further provide one or more services 204. The services 204 can include, e.g., software update, customer support, sensor data collection/logging, remote access, remote or distributed control, or use suggestions (e.g., based on collected operation data 204 to improve performance, reduce utility cost, etc.). Data associated with the services 204 can be stored at the central server or cloud-computing system 164 and the central server or cloud-computing system 164 can retrieve and transmit the data at an appropriate time (e.g., at regular intervals, upon receiving request from a user, etc.).

One salient feature of the described extensible devices and services platform, as illustrated in FIG. 2, is a processing engines 206, which can be concentrated at a single server or distributed among several different computing entities without limitation. Processing engines 206 can include engines configured to receive data from a set of devices (e.g., via the Internet or a hubbed network), to index the data, to analyze the data and/or to generate statistics based on the analysis or as part of the analysis. The analyzed data can be stored as derived data 208. Results of the analysis or statistics can thereafter be transmitted back to a device providing ops data used to derive the results, to other devices, to a server providing a webpage to a user of the device, or to other non-device entities. For example, use statistics, use statistics relative to use of other devices, use patterns, and/or statistics summarizing sensor readings can be transmitted. The results or statistics can be provided via the Internet 162. In this manner, processing engines 206 can be configured and programmed to derive a variety of useful information from the operational data obtained from the smart home. A single server can include one or more engines.

The derived data can be highly beneficial at a variety of different granularities for a variety of useful purposes, ranging from explicit programmed control of the devices on a per-home, per-neighborhood, or per-region basis (for example, demand-response programs for electrical utilities), to the generation of inferential abstractions that can assist on a per-home basis (for example, an inference can be drawn that the homeowner has left for vacation and so security detection equipment can be put on heightened sensitivity), to the generation of statistics and associated inferential abstractions that can be used for government or charitable purposes. For example, processing engines 206 can generate statistics about device usage across a population of devices and send the statistics to device users, service providers or other entities (e.g., that have requested or may have provided monetary compensation for the statistics). As specific illustrations, statistics can be transmitted to charities 222, governmental entities 224 (e.g., the Food and Drug Administration or the Environmental Protection Agency), academic institutions 226 (e.g., university researchers), businesses 228 (e.g., providing device warranties or service to related equipment), or utility companies 230. These entities can use the data to form programs to reduce energy usage, to preemptively service faulty equipment, to prepare for high service demands, to track past service performance, etc., or to perform any of a variety of beneficial functions or tasks now known or hereinafter developed.

Figure 3:
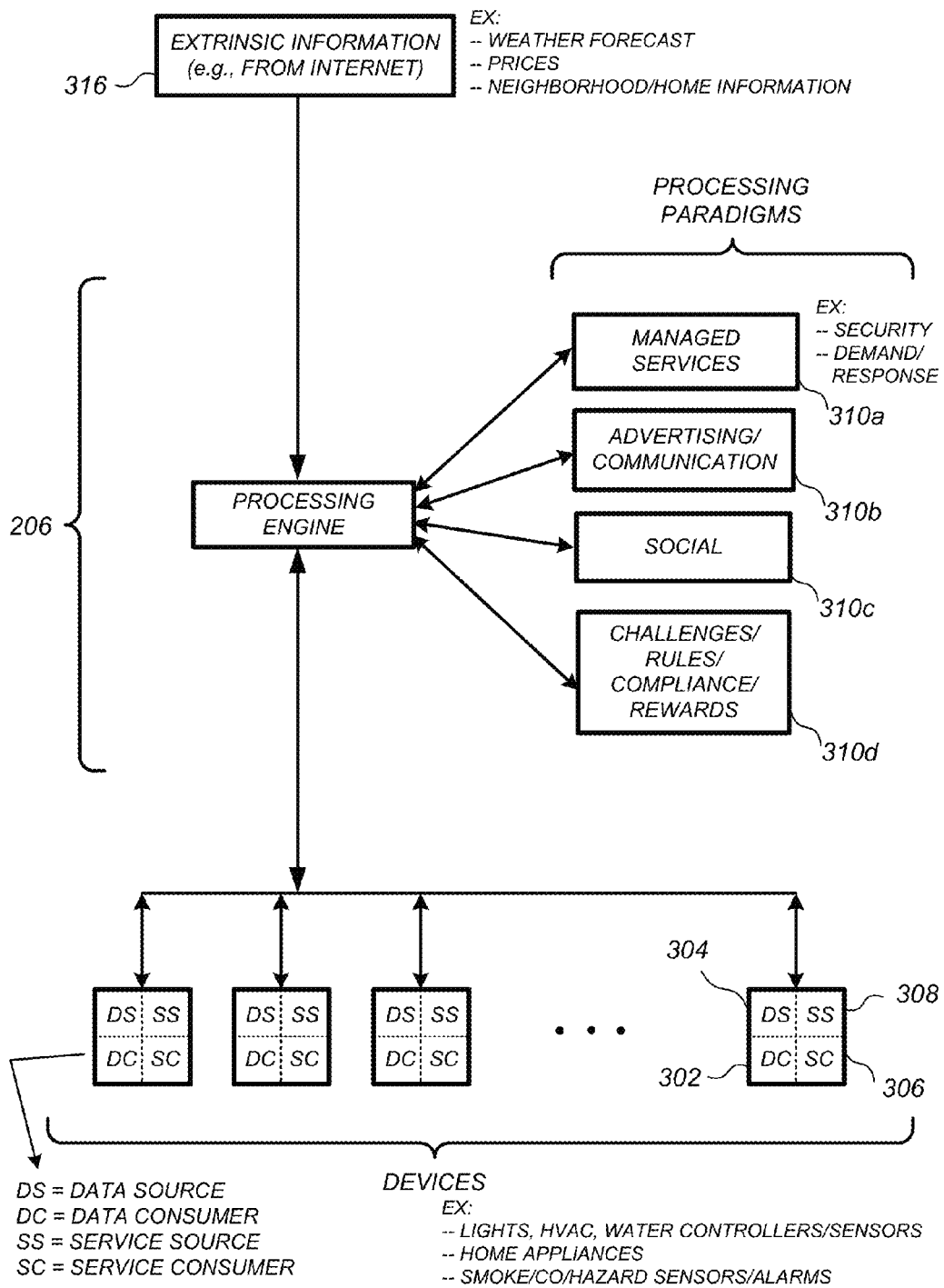
FIG. 3 illustrates an abstracted functional view of the extensible devices and services platform of FIG. 2, according to some embodiments.

FIG. 3 illustrates an abstracted functional view of the extensible devices and services platform of FIG. 2, with particular reference to the processing engine 206 as well as the devices of the smart home. Even though the devices situated in the smart home will have an endless variety of different individual capabilities and limitations, they can all be thought of as sharing common characteristics in that each of them is a data consumer 302 (DC), a data source 304 (DS), a services consumer 306 (SC), and a services source 308 (SS). Advantageously, in addition to providing the essential control information needed for the devices to achieve their local and immediate objectives, the extensible devices and services platform can also be configured to harness the large amount of data that is flowing out of these devices. In addition to enhancing or optimizing the actual operation of the devices themselves with respect to their immediate functions, the extensible devices and services platform can also be directed to "repurposing" that data in a variety of automated, extensible, flexible, and/or scalable ways to achieve a variety of useful objectives. These objectives may be predefined or adaptively identified based on, e.g., usage patterns, device efficiency, and/or user input (e.g., requesting specific functionality).

For example, FIG. 3 shows processing engine 206 as including a number of paradigms 310. Processing engine 206 can include a managed services paradigm 310a that monitors and manages primary or secondary device functions. The device functions can include ensuring proper operation of a device given user inputs, estimating that (e.g., and responding to) an intruder is or is attempting to be in a dwelling, detecting a failure of equipment coupled to the device (e.g., a light bulb having burned out), implementing or otherwise responding to energy demand response events, or alerting a user of a current or predicted future event or characteristic. Processing engine 206 can further include an advertising/communication paradigm 310b that estimates characteristics (e.g., demographic information), desires and/or products of interest of a user based on device usage. Services, promotions, products or upgrades can then be offered or automatically provided to the user. Processing engine 206 can further include a social paradigm 310c that uses information from a social network, provides information to a social network (for example, based on device usage), processes data associated with user and/or device interactions with the social network platform. For example, a user's status as reported to their trusted contacts on the social network could be updated to indicate when they are home based on light detection, security system inactivation or device usage detectors. As another example, a user may be able to share device-usage statistics with other users. Processing engine 206 can include a challenges/rules/compliance/rewards paradigm 310d that informs a user of challenges, rules, compliance regulations and/or rewards and/or that uses operation data to determine whether a challenge has been met, a rule or regulation has been complied with and/or a reward has been earned. The challenges, rules or regulations can relate to efforts to conserve energy, to live safely (e.g., reducing exposure to toxins or carcinogens), to conserve money and/or equipment life, to improve health, etc.

Processing engine can integrate or otherwise utilize extrinsic information 316 from extrinsic sources to improve the functioning of one or more processing paradigms. Extrinsic information 316 can be used to interpret operational data received from a device, to determine a characteristic of the environment near the device (e.g., outside a structure that the device is enclosed in), to determine services or products available to the user, to identify a social network or social-network information, to determine contact information of entities (e.g., public-service entities such as an emergency-response team, the police or a hospital) near the device, etc., to identify statistical or environmental conditions, trends or other information associated with a home or neighborhood, and so forth.

An extraordinary range and variety of benefits can be brought about by, and fit within the scope of, the described extensible devices and services platform, ranging from the ordinary to the profound. Thus, in one "ordinary" example, each bedroom of the smart home can be provided with a smoke/fire/CO alarm that includes an occupancy sensor, wherein the occupancy sensor is also capable of inferring (e.g., by virtue of motion detection, facial recognition, audible sound patterns, etc.) whether the occupant is asleep or awake. If a serious fire event is sensed, the remote security/monitoring service or fire department is advised of how many occupants there are in each bedroom, and whether those occupants are still asleep (or immobile) or whether they have properly evacuated the bedroom. While this is, of course, a very advantageous capability accommodated by the described extensible devices and services platform, there can be substantially more "profound" examples that can truly illustrate the potential of a larger "intelligence" that can be made available. By way of perhaps a more "profound" example, the same data bedroom occupancy data that is being used for fire safety can also be "repurposed" by the processing engine 206 in the context of a social paradigm of neighborhood child development and education. Thus, for example, the same bedroom occupancy and motion data discussed in the "ordinary" example can be collected and made available for processing (properly anonymized) in which the sleep patterns of schoolchildren in a particular ZIP code can be identified and tracked. Localized variations in the sleeping patterns of the schoolchildren may be identified and correlated, for example, to different nutrition programs in local schools.

Figure 4:
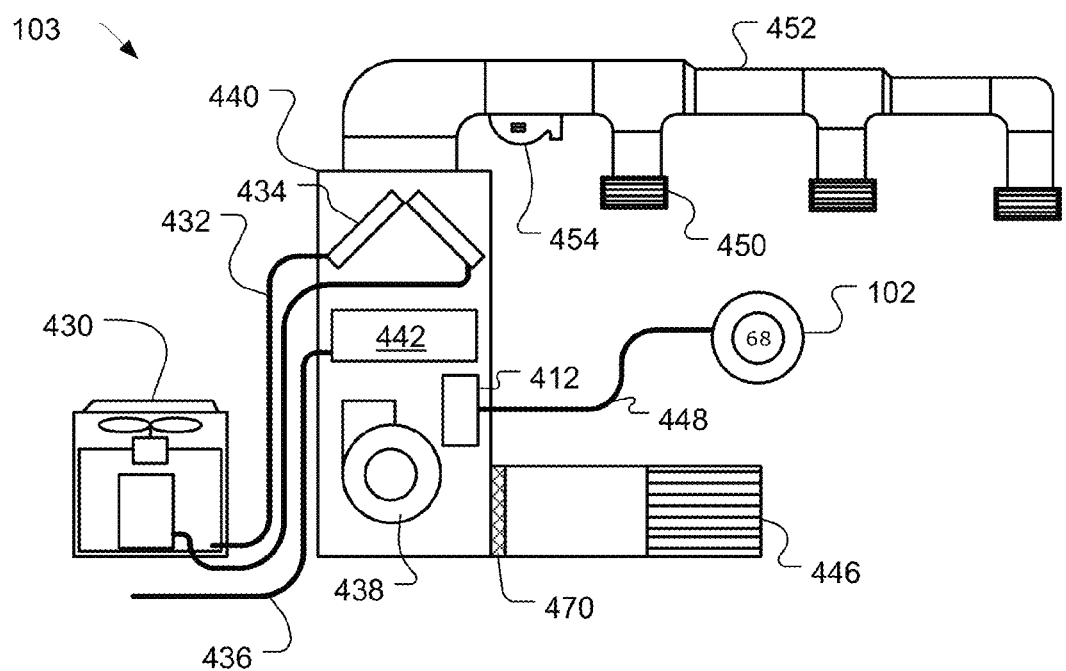
FIG. 4 is a schematic diagram of an HVAC system, according to some embodiments.

FIG. 4 is a schematic diagram of an HVAC system, according to some embodiments. HVAC system 103 provides heating, cooling, ventilation, and/or air handling for an enclosure, such as structure 150 depicted in FIG. 1. System 103 depicts a forced air type heating and cooling system, although according to other embodiments, other types of HVAC systems could be used such as radiant heat based systems, heat-pump based systems, and others.

For carrying out the heating function, heating coils or elements 442 within air handler 440 provide a source of heat using electricity or gas via line 436. Cool air is drawn from the enclosure via return air duct 446 through filter 470, using fan 438 and is heated through heating coils or elements 442. The heated air flows back into the enclosure at one or more locations via supply air duct system 452 and supply air registers such as register 450. In cooling, an outside compressor 430 passes a refrigerant gas through a set of heat exchanger coils and then through an expansion valve. The gas then goes through line 432 to the cooling coils or evaporator coils 434 in the air handler 440 where it expands, cools and cools the air being circulated via fan 438. A humidifier 454 may optionally be included in various embodiments that returns moisture to the air before it passes through duct system 452. Although not shown in FIG. 4, alternate embodiments of HVAC system 103 may have other functionality such as venting air to and from the outside, one or more dampers to control airflow within the duct system 452 and an emergency heating unit. Overall operation of HVAC system 103 is selectively actuated by control electronics 412 communicating with thermostat 102 over control wires 448.

Figure 5A:
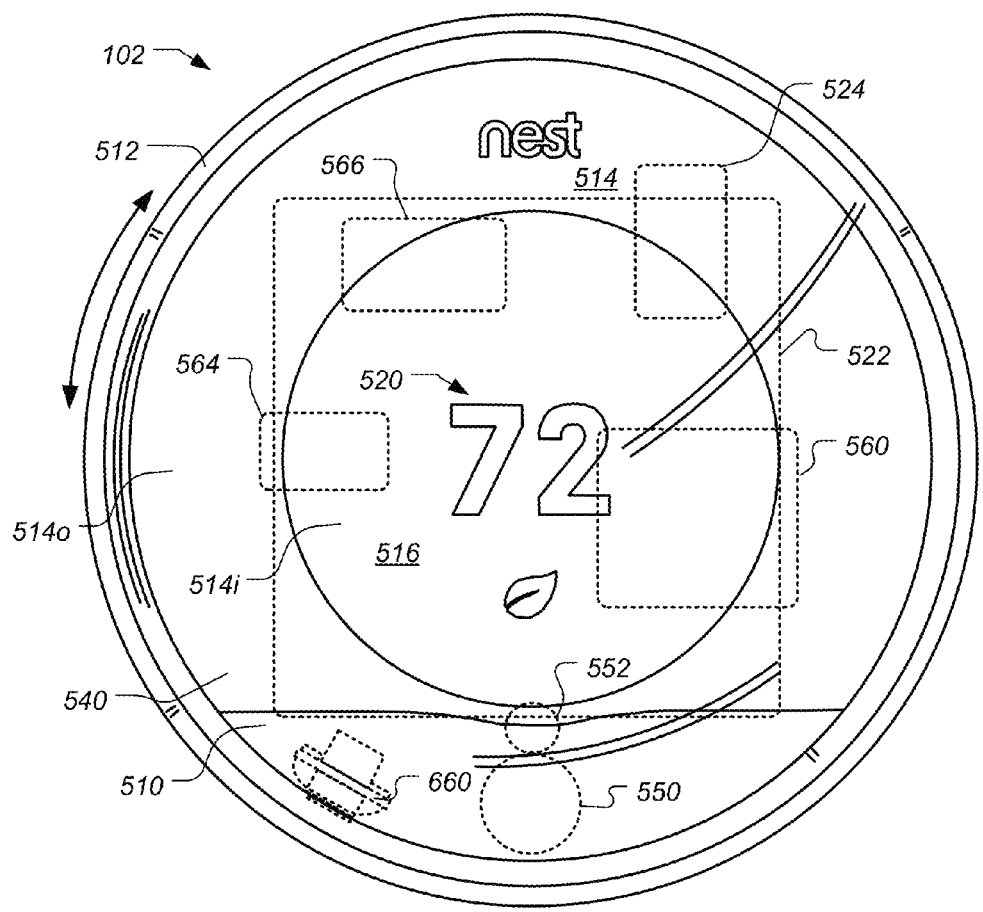
FIGS. 5A-5D illustrate a thermostat having a visually pleasing, smooth, sleek and rounded exterior appearance while at the same time including one or more sensors for detecting occupancy and/or users, according to some embodiments.
Figure 5B:
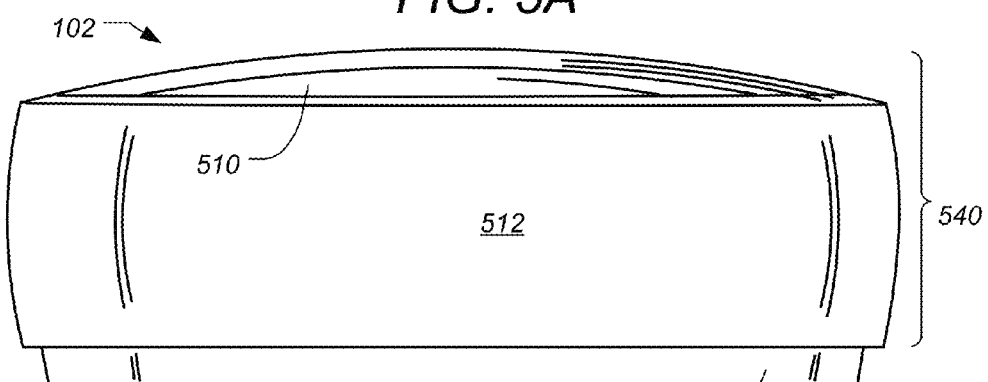
Figure 5C:
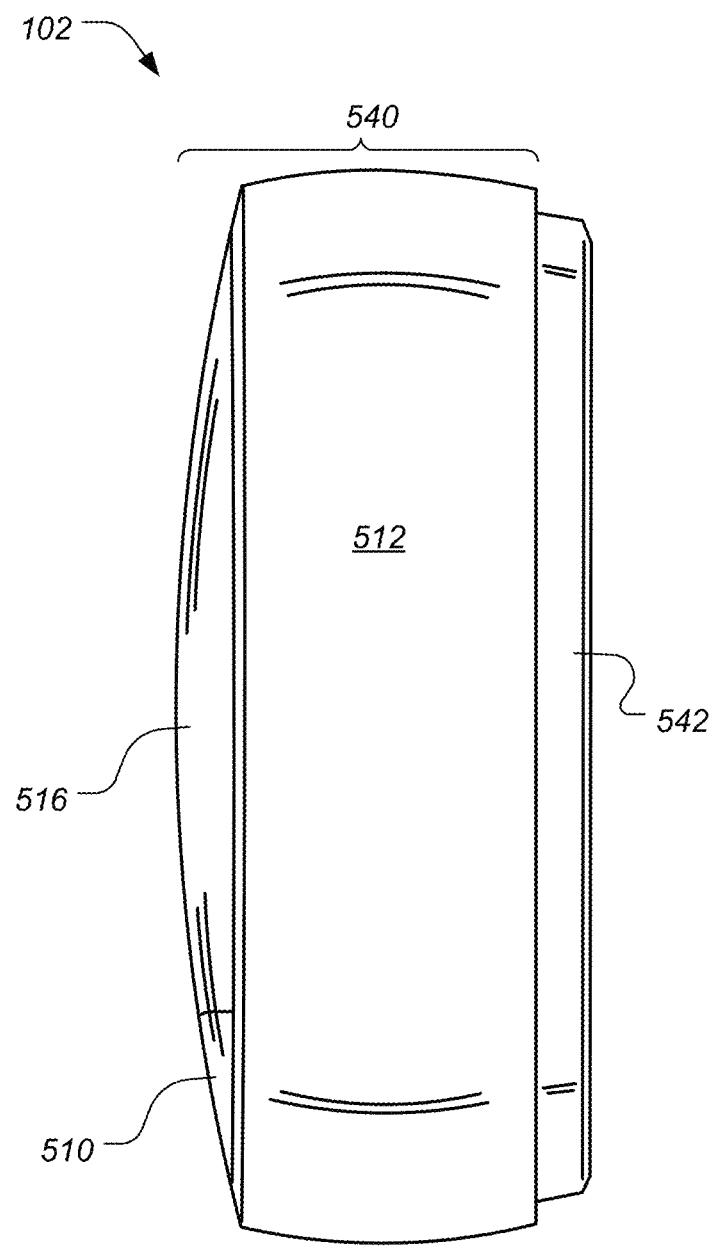
Figure 5D:
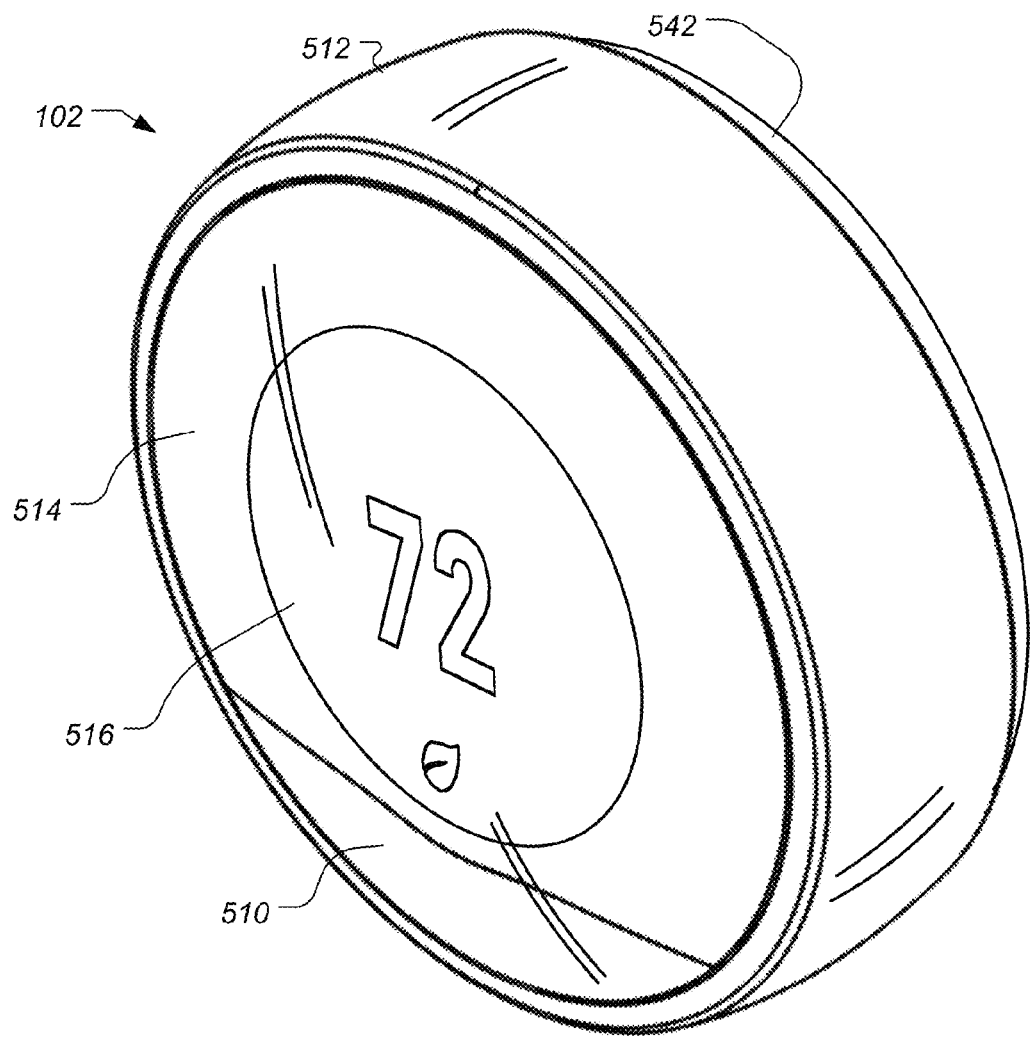

FIGS. 5A-5D illustrate a thermostat having a visually pleasing, smooth, sleek and rounded exterior appearance while at the same time including one or more sensors for detecting occupancy and/or users, according to some embodiments. FIG. 5A is front view, FIG. 5B is a bottom elevation, FIG. 5C is a right side elevation, and FIG. 5D is prospective view of thermostat 102. Unlike many prior art thermostats, thermostat 102 has a sleek, simple, uncluttered and elegant design that does not detract from home decoration, and indeed can serve as a visually pleasing centerpiece for the immediate location in which it is installed. Moreover, user interaction with thermostat 102 is facilitated and greatly enhanced over known conventional thermostats by the design of thermostat 102. The thermostat 102 includes control circuitry and is electrically connected to an HVAC system 103, such as is shown in FIGS. 1-4. Thermostat 102 is wall mountable, is circular in shape, and has an outer rotatable ring 512 for receiving user input. Thermostat 102 is circular in shape in that it appears as a generally disk-like circular object when mounted on the wall. Thermostat 102 has a large convex rounded front face lying inside the outer ring 512. According to some embodiments, thermostat 102 is approximately 80 mm in diameter and protrudes from the wall, when wall mounted, by 32 mm. The outer rotatable ring 512 allows the user to make adjustments, such as selecting a new setpoint temperature. For example, by rotating the outer ring 512 clockwise, the realtime (i.e. currently active) setpoint temperature can be increased, and by rotating the outer ring 512 counter-clockwise, the realtime setpoint temperature can be decreased. The front face of the thermostat 102 comprises a clear cover 514 that according to some embodiments is polycarbonate, and a Fresnel lens 510 having an outer shape that matches the contours of the curved outer front face of the thermostat 102. According to some embodiments, the Fresnel lens elements are formed on the interior surface of the Fresnel lens piece 510 such that they are not obviously visible by viewing the exterior of the thermostat 102. Behind the Fresnel lens is a passive infrared sensor 550 for detecting occupancy, and the Fresnel lens piece 510 is made from a high-density polyethylene (HDPE) that has an infrared transmission range appropriate for sensitivity to human bodies. As shown in FIGS. 5A-5D, the front edge of rotating ring 512, front face 514 and Fresnel lens 510 are shaped such that they together form a, integrated convex rounded front face that has a common outward arc or spherical shape gently arcing outward.

Although being formed from a single lens-like piece of material such as polycarbonate, the cover 514 has two different regions or portions including an outer portion 514o and a central portion 514i. According to some embodiments, the cover 514 is painted or smoked around the outer portion 514o, but leaves the central portion 514i visibly clear so as to facilitate viewing of an electronic display 516 disposed thereunderneath. According to some embodiments, the curved cover 514 acts as a lens that tends to magnify the information being displayed in electronic display 516 to users. According to some embodiments the central electronic display 516 is a dot-matrix layout (i.e. individually addressable) such that arbitrary shapes can be generated, rather than being a segmented layout. According to some embodiments, a combination of dot-matrix layout and segmented layout is employed. According to some embodiments, central display 516 is a backlit color liquid crystal display (LCD). An example of information displayed on the electronic display 516 is illustrated in FIG. 5A, and includes central numerals 520 that are representative of a current setpoint temperature. The thermostat 102 is preferably constructed such that the electronic display 516 is at a fixed orientation and does not rotate with the outer ring 512, so that the electronic display 516 remains easily read by the user. For some embodiments, the cover 514 and Fresnel lens 510 also remain at a fixed orientation and do not rotate with the outer ring 512. According to one embodiment in which the diameter of the thermostat 102 is about 80 mm, the diameter of the electronic display 516 is about 45 mm. According to some embodiments the gently outwardly curved shape of the front surface of thermostat 102, which is made up of cover 514, Fresnel lens 510 and the front facing portion of ring 512, is spherical, and matches a sphere having a radius of between 100 mm and 150 mm. According to some embodiments, the radius of the spherical shape of the thermostat front is about 136 mm.

Motion sensing with PIR sensor 550 as well as other techniques can be used in the detection and/or predict of occupancy, as is described further in the commonly assigned U.S. Ser. No. 12/881,430, which is incorporated herein by reference. According to some embodiments, occupancy information is used in generating an effective and efficient scheduled program. A second downwardly-tilted PIR sensor 552 is provided to detect an approaching user. The proximity sensor 552 can be used to detect proximity in the range of about one meter so that the thermostat 102 can initiate "waking up" when the user is approaching the thermostat and prior to the user touching the thermostat. Such use of proximity sensing is useful for enhancing the user experience by being "ready" for interaction as soon as, or very soon after the user is ready to interact with the thermostat. Further, the wake-up-on-proximity functionality also allows for energy savings within the thermostat by "sleeping" when no user interaction is taking place our about to take place.

According to some embodiments, for the combined purposes of inspiring user confidence and further promoting visual and functional elegance, the thermostat 102 is controlled by only two types of user input, the first being a rotation of the outer ring 512 as shown in FIG. 5A (referenced hereafter as a "rotate ring" or "ring rotation" input), and the second being an inward push on head unit 540 until an audible and/or tactile "click" occurs (referenced hereafter as an "inward click" or simply "click" input). For such embodiments, the head unit 540 is an assembly that includes all of the outer ring 512, cover 514, electronic display 516, and the Fresnel lens 510. When pressed inwardly by the user, the head unit 540 travels inwardly by a small amount, such as 0.5 mm, against an interior metallic dome switch (not shown), and then springably travels back outwardly by that same amount when the inward pressure is released, providing a satisfying tactile "click" sensation to the user's hand, along with a corresponding gentle audible clicking sound. Thus, for the embodiment of FIGS. 5A-5D, an inward click can be achieved by direct pressing on the outer ring 512 itself, or by indirect pressing of the outer ring by virtue of providing inward pressure on the cover 514, lens 510, or by various combinations thereof. For other embodiments, the thermostat 102 can be mechanically configured such that only the outer ring 512 travels inwardly for the inward click input, while the cover 514 and lens 510 remain motionless. It is to be appreciated that a variety of different selections and combinations of the particular mechanical elements that will travel inwardly to achieve the "inward click" input are within the scope of the present teachings, whether it be the outer ring 512 itself, some part of the cover 514, or some combination thereof. However, it has been found particularly advantageous to provide the user with an ability to quickly go back and forth between registering "ring rotations" and "inward clicks" with a single hand and with minimal amount of time and effort involved, and so the ability to provide an inward click directly by pressing the outer ring 512 has been found particularly advantageous, since the user's fingers do not need to be lifted out of contact with the device, or slid along its surface, in order to go between ring rotations and inward clicks. Moreover, by virtue of the strategic placement of the electronic display 516 centrally inside the rotatable ring 512, a further advantage is provided in that the user can naturally focus their attention on the electronic display throughout the input process, right in the middle of where their hand is performing its functions. The combination of intuitive outer ring rotation, especially as applied to (but not limited to) the changing of a thermostat's setpoint temperature, conveniently folded together with the satisfying physical sensation of inward clicking, together with accommodating natural focus on the electronic display in the central midst of their fingers' activity, adds significantly to an intuitive, seamless, and downright fun user experience. Further descriptions of advantageous mechanical user-interfaces and related designs, which are employed according to some embodiments, can be found in U.S. Ser. No. 13/033,573, U.S. Ser. No. 29/386,021, and U.S. Ser. No. 13/199,108, all of which are incorporated herein by reference.

FIGS. 5B and 5C are bottom and right side elevation views of the thermostat 102, which has been found to provide a particularly pleasing and adaptable visual appearance when viewed against a variety of different wall colors and wall textures in a variety of different home environments and home settings. While the thermostat itself will functionally adapt to the user's schedule as described herein and in one or more of the commonly assigned incorporated applications, supra, the outer shape is specially configured to convey a "chameleon" quality or characteristic such that the overall device appears to naturally blend in, in a visual and decorative sense, with many of the most common wall colors and wall textures found in home and business environments, at least in part because it will appear to assume the surrounding colors and even textures when viewed from many different angles.

According to some embodiments, the thermostat 102 includes a processing system 560, display driver 564 and a wireless communications system 566. The processing system 560 is adapted to cause the display driver 564 and display 516 to display information to the user, and to receiver user input via the rotatable ring 512. The processing system 560, according to some embodiments, is capable of carrying out the governance of the operation of thermostat 102 including various user interface features. The processing system 560 is further programmed and configured to carry out other operations as described further hereinbelow and/or in other ones of the commonly assigned incorporated applications. For example, processing system 560 is further programmed and configured to maintain and update a thermodynamic model for the enclosure in which the HVAC system is installed, such as described in U.S. Ser. No. 12/881,463, and in International Patent App. No. PCT/US11/51579, both of which are incorporated herein by reference. According to some embodiments, the wireless communications system 566 is used to communicate with devices such as personal computers and/or other thermostats or HVAC system components, which can be peer-to-peer communications, communications through one or more servers located on a private network, or and/or communications through a cloud-based service.

According to some embodiments, for ease of installation, configuration and/or upgrading, especially by a non-expert installer such as a user, the thermostat 102 includes a head unit 540 and a backplate (or wall dock) 542. As is described hereinabove, thermostat 102 is wall mounted and has circular in shape and has an outer rotatable ring 512 for receiving user input. Head unit 540 of thermostat 102 is slidably mountable onto back plate 542 and slidably detachable therefrom. According to some embodiments the connection of the head unit 540 to backplate 542 can be accomplished using magnets, bayonet, latches and catches, tabs or ribs with matching indentations, or simply friction on mating portions of the head unit 540 and backplate 542. Also shown in FIG. 5A is a rechargeable battery 522 that is recharged using recharging circuitry 524 that uses power from backplate that is either obtained via power harvesting (also referred to as power stealing and/or power sharing) from the HVAC system control circuit(s) or from a common wire, if available, as described in further detail in co-pending patent application U.S. Ser. Nos. 13/034,674, and 13/034,678, which are incorporated by reference herein. According to some embodiments, rechargeable battery 522 is a single cell lithium-ion, or a lithium-polymer battery.

Figure 6A:
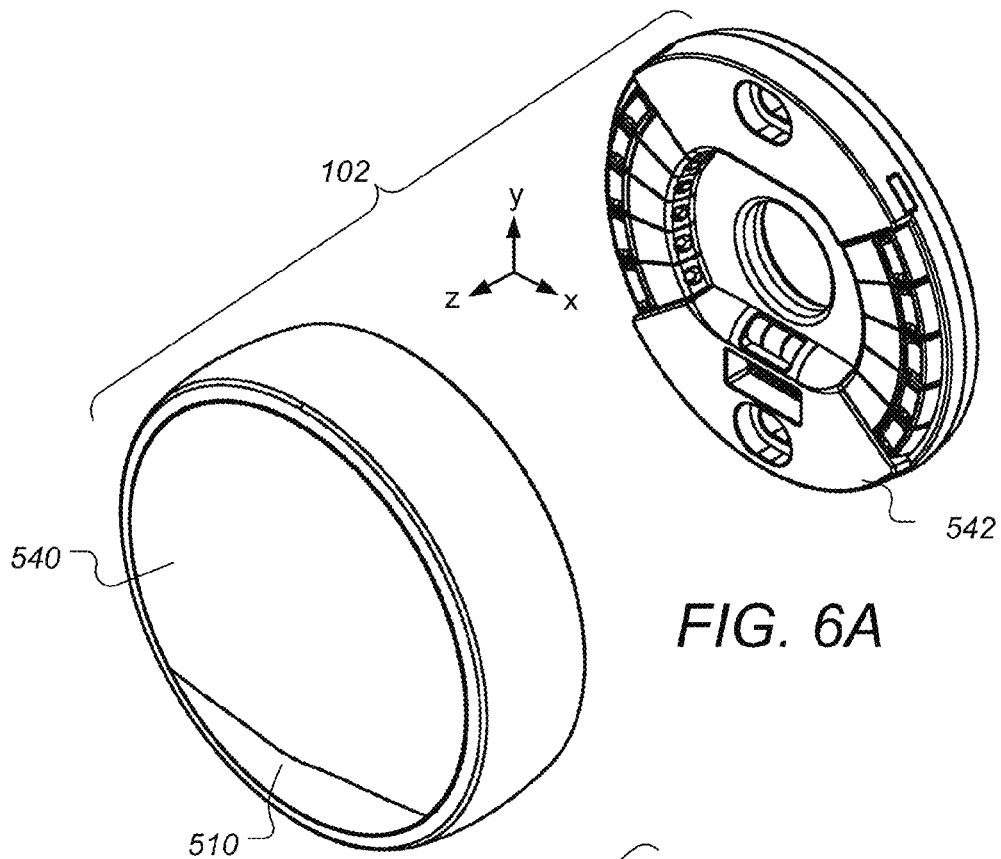
FIGS. 6A-6B illustrate exploded front and rear perspective views, respectively, of a thermostat with respect to its two main components, according to some embodiments.
Figure 6B:
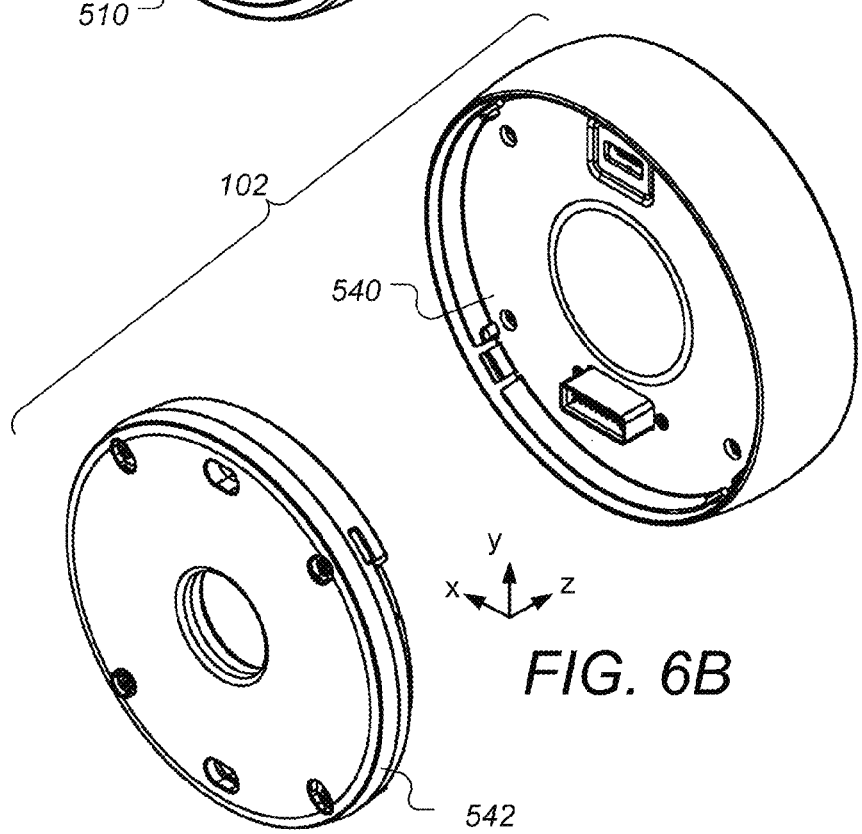

FIGS. 6A-6B illustrate exploded front and rear perspective views, respectively, of the thermostat 102 with respect to its two main components, which are the head unit 540 and the backplate 542. Further technical and/or functional descriptions of various ones of the electrical and mechanical components illustrated hereinbelow can be found in one or more of the commonly assigned applications, such as U.S. Ser. No. 13/199,108, incorporated herein by reference. In the drawings shown herein, the "z" direction is outward from the wall, the "y" direction is the toe-to-head direction relative to a walk-up user, and the "x" direction is the user's left-to-right direction.

Figure 6C:
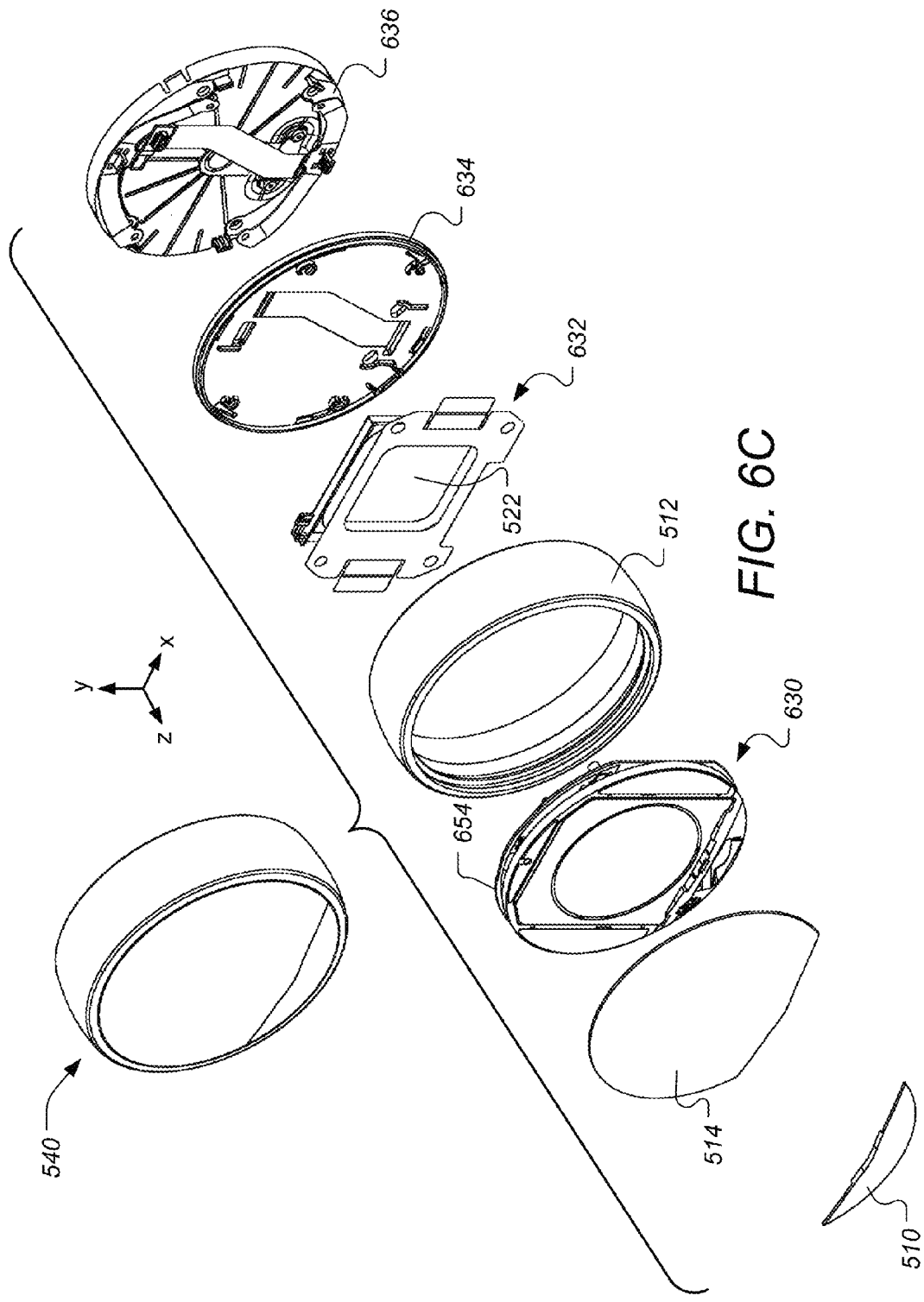
FIGS. 6C-6D illustrate exploded front and rear perspective views, respectively, of a head unit with respect to its primary components, according to some embodiments.
Figure 6D:
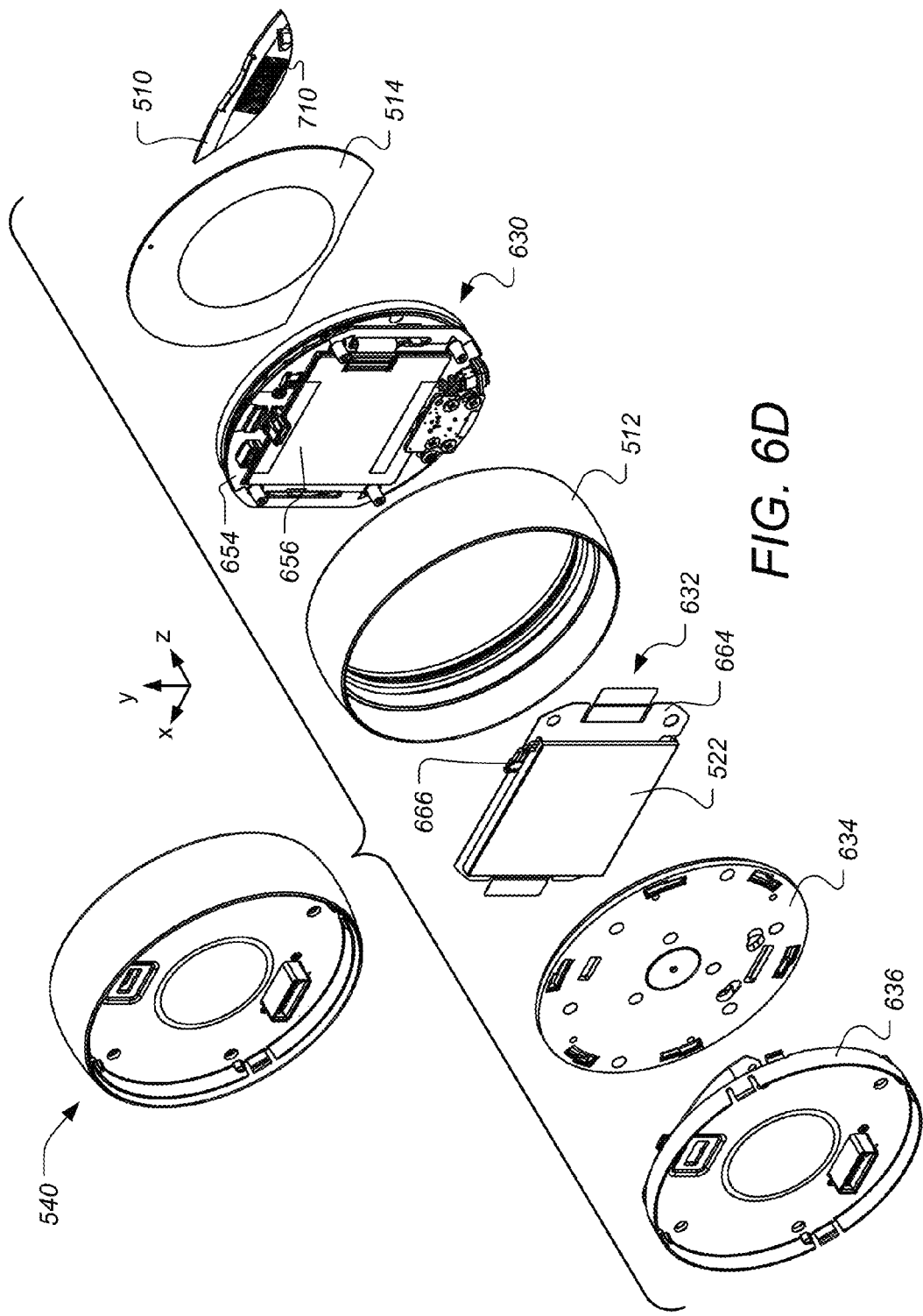

FIGS. 6C-6D illustrate exploded front and rear perspective views, respectively, of the head unit 540 with respect to its primary components. Head unit 540 includes, back cover 636, bottom frame 634, battery assembly 632, the outer ring 512 (which is manipulated for ring rotations), head unit frontal assembly 630, front lens 514, and Fresnel lens 510. Electrical components on the head unit frontal assembly 630 can connect to electrical components on the back plate 542 by virtue of ribbon cables and/or other plug type electrical connectors on back cover 636. Head unit frontal assembly 630 is secured to head unit back cover 636 and bottom frame 634 via four bosses. The outer ring 512 is thereby held between a bearing surface on the head unit top frame 652 (shown in FIGS. 6E and 6F, infra) and bearing surfaces on the bottom frame 634. In particular motion of the ring 512 in z direction is constrained by flat bearing surfaces on the top frame 652 and bottom frame 634, while motion of the ring in x and y directions are constrained by circular rounded surfaces on the bottom frame 634. According to some embodiments, the bearing surfaces of the bottom frame 634 and/or the top frame 652 are greased and/or otherwise lubricated to both smooth and dampen rotational movement for ring 512. Attached to top frame 652 is the head unit printed circuit board (PCB) 654 on which much of the head unit circuitry is mounted including some or all of processing system 560, display driver 564, wireless communication system 566 and battery recharging circuitry 524 as shown and described with respect to FIG. 5A, as well as one or more additional memory storage components. According to some embodiments, circuitry and components are mounted on both sides of PCB 654. A shielding can 656 (visible in FIG. 6D) surrounds most or all of the head unit circuitry and components on PCB 654 and serves to shield the circuitry and components from electromagnetic interference. Although not visible, according to some embodiments, shielding can 656 surrounds circuitry and components on both sides of PCB 654.

Battery assembly 632 includes a rechargeable Lithium-Ion battery 522, which for one preferred embodiment has a nominal voltage of 3.7 volts and a nominal capacity of 560 mAh. To extend battery life, however, the battery 522 is normally not charged beyond 450 mAh by the thermostat battery charging circuitry. Moreover, although the battery 522 is rated to be capable of being charged to 4.2 volts, the thermostat battery charging circuitry normally does not charge it beyond 3.95 volts. Battery assembly 632 also includes connecting wires 666, and a battery mounting film 664 that is attached to battery 522 using a strong adhesive and to the rear shielding can 656 of head unit PCB 654 using a relatively weaker adhesive. By using a weaker adhesive to mount the film 664 of battery assembly 632 to shielding can 656 of the PCB 654, subsequent replacement of battery assembly 632 (including battery 522) is facilitated. According to some embodiments, the battery assembly 632 is user-replaceable.

Figure 6E:
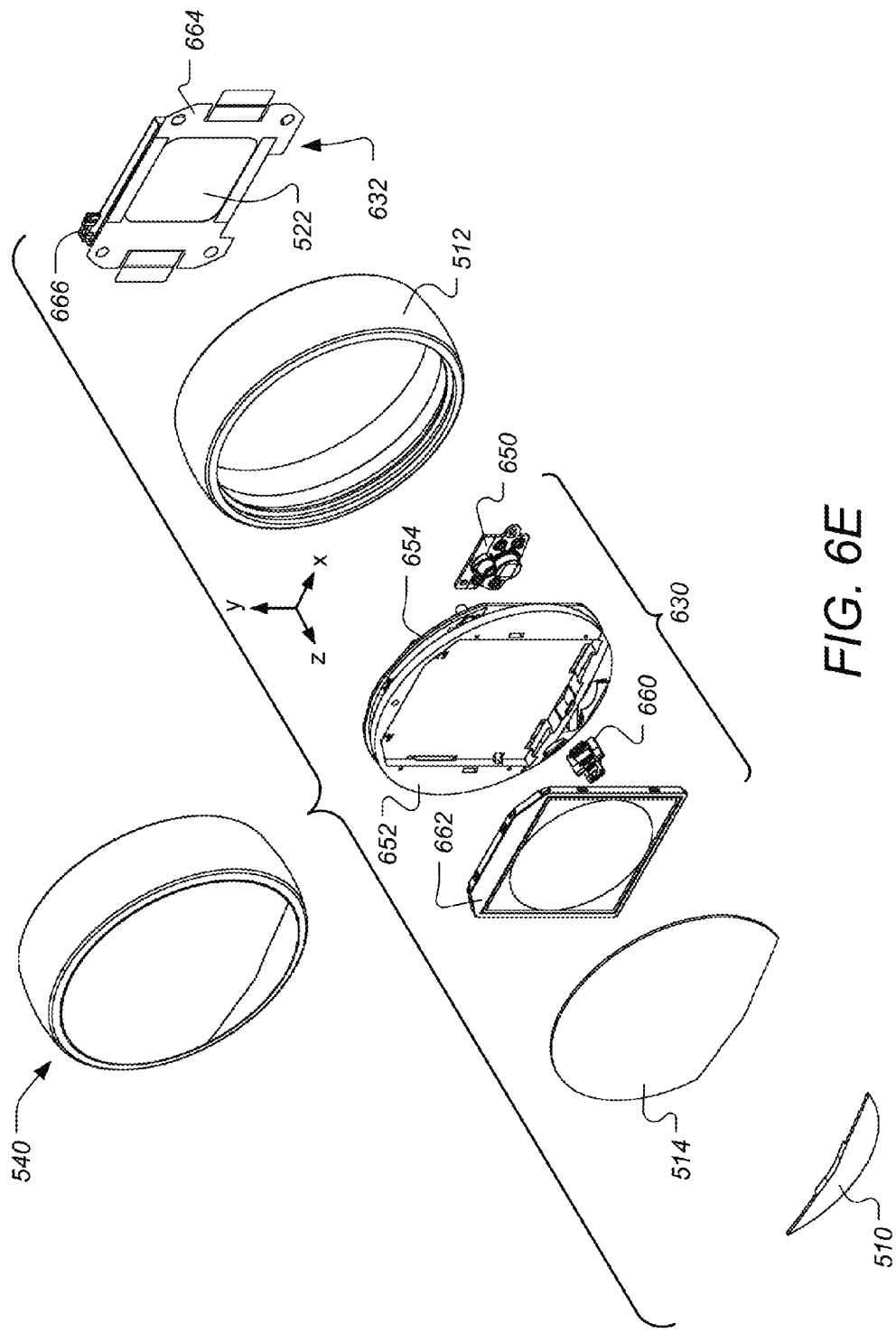

FIGS. 6E-6F illustrate exploded front and rear perspective views, respectively, of the head unit frontal assembly 630 with respect to its primary components. Head unit frontal assembly 630 comprises a head unit top frame 652, head unit PCB 654, and LCD module 662. Daughter board 660 connects to the head unit PCB 654 and includes an optical finger navigation (OFN) module that is configured and positioned to sense rotation of the outer ring 512. The OFN module is directed radially outwardly (that is, perpendicular to the z-axis and away from the center of the thermostat). The OFN module uses methods analogous to the operation of optical computer mice to sense the movement of a textured surface on an inner face of the outer ring 512. Notably, the OFN module is one of the very few sensors that is controlled by the relatively power-intensive head unit microprocessor rather than the relatively low-power back plate microprocessor. This is achievable without excessive power drain implications because the head unit microprocessor will invariably be awake already when the user is manually turning the dial, so there is no excessive wake-up power drain anyway. Advantageously, very fast response can also be provided by the head unit microprocessor. Also visible in FIGS. 6E and 6F is Fresnel lens 510 that operates in conjunction with two PIR motion sensors mounted on PIR board 650. Two or more temperature sensors are also located in the head unit 540 and cooperate to acquire reliable and accurate room temperature data. One of the temperature sensors is located on daughter board 660 and the other is mounted on the head unit PCB 654.

FIGS. 6G-6H illustrate exploded front and rear perspective views, respectively, of the back plate unit 542 with respect to its primary components, according to some embodiments. Back plate unit 542 comprises a back plate rear plate 682, a back plate circuit board 680, and a back plate cover 670. Visible in FIG. 6G are the HVAC wire connectors 684 that include integrated mechanical wire insertion sensing circuitry, and relatively large capacitors 686 that are used by part of the power stealing circuitry that is mounted on the back plate circuit board 680. According to some embodiments, backplate 542 includes electronics and a temperature/humidity sensor in housing. Wire connectors 684 are provided to allow for connection to HVAC system wires, which pass though the large central circular opening 690, which is visible in each of the backplate primary components. Also visible in each of the backplate primary components are two mounting holes 692 and 694 for use in fixing the backplate to the wall. The single top wall-mounting hole 692 on backplate has been found to allow for self-leveling during installation, thereby further enhancing the ease of a non-expert installation of the thermostat 102. Also visible in FIGS. 6G and 6H are bubble level 672 and holder 674 for further facilitating user-installability of the thermostat 102.

Figure 7A:
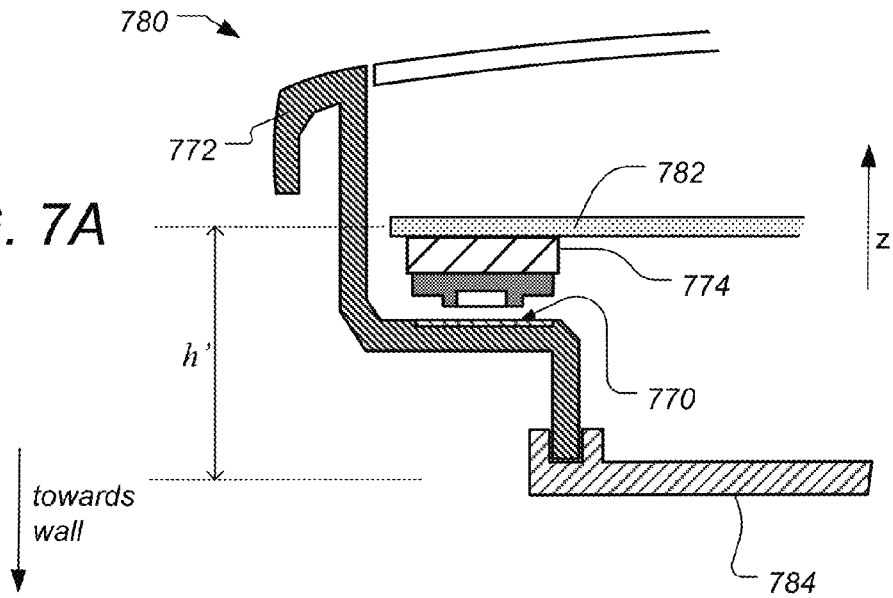
FIGS. 7A-7B are cross-sectional diagrams of two different designs for optically sensing rotational movement of a rotating ring of a thermostat.
Figure 7B:
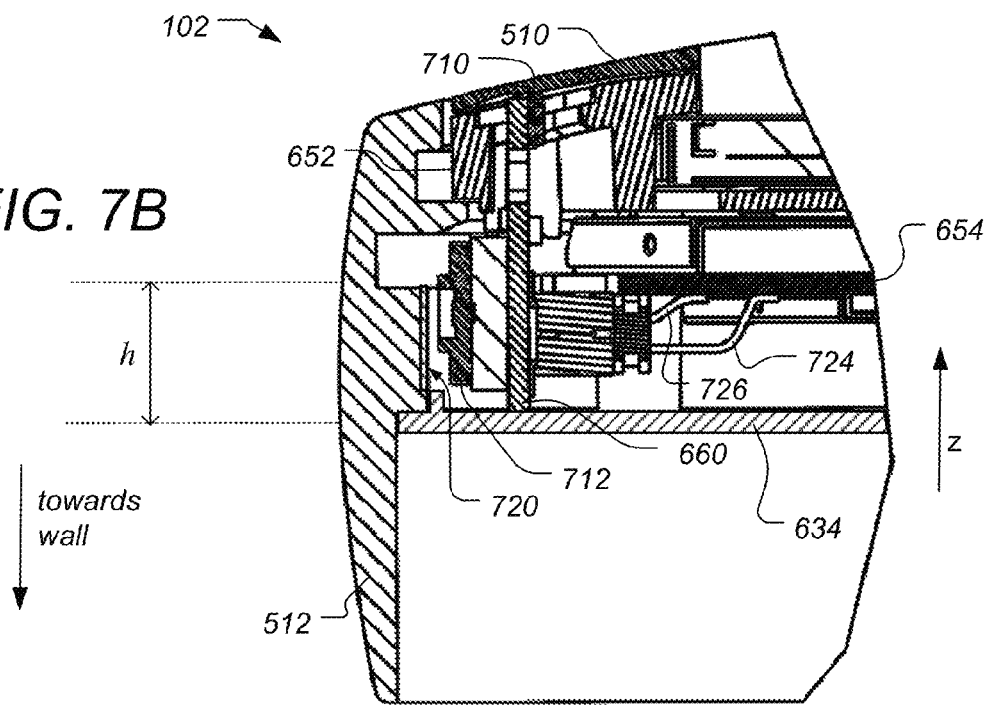

FIGS. 7A-7B are cross-sectional diagrams of two different designs for optically sensing rotational movement of a rotating ring of a thermostat. FIG. 7A represents a design of a thermostat 780, which makes use of an optical sensor 774 directed towards the wall, when thermostat 780 is wall mounted. For further details of an example of such a design, see, U.S. patent application Ser. No. 13/466,026 filed on May 7, 2012, which is incorporated by reference herein. A rotating ring 772 rotatably slides on a bottom frame 784. The optical sensor 774 is mounted on a circuit board 782 and is directed toward the wall (in the negative z-direction) on a textured surface 770 of ring 772. Based on movements detected by the optical sensor 774 of the textured surface 770 or ring 772 rotational movement of ring 772 can be determined. Note that in the design represented in FIG. 7A, the optical sensor is directed axially (that is, in a direction parallel to the central axis of the rotating ring), and towards a textured surface on the ring that is parallel to the wall. The resulting distance h' is shown that is measured from the circuit board 782 to the bottom frame 787.

FIG. 7B is a cross-section showing an outwardly radially directed optical sensor for sensing ring rotational movement, according to some embodiments. In FIG. 7B, rotating ring slidably rotates on bottom frame 634. The optical sensor 712 is mounted on a daughter board 660 and has electrical connections, such as conductors 724 and 726 to head unit PCB 654. The processor on PCB 654 is programmed to interpret the electrical signals from the optical sensor 712 and determine therefrom rotational movement of the ring 512.

The optical sensor 712 is directed radially outwardly (that is, in a radial direction outwards from the central axis of thermostat 102 and ring 512, which is parallel to the wall when thermostat 102 is wall mounted) towards a textured surface 720 on a curved inner surface of ring 512. According to some embodiments, the optical sensor 712, is an optical finger navigation (OFN) module, such as known for use in navigation on some smart phones, which has been found to provide suitable accuracy in detecting movement of the textured surface 720 on an inner surface of ring 512. According to other embodiments, other types of suitable optical sensors, such as are known for use in optical mouse pointers, can be used. By mounting the optical sensor 712 such that it is directly outwardly radially to detect ring movements on an inner surface 720 of the ring 512, a dimension h between the head unit PCB 654 and bottom frame 634 can be achieved with is significantly smaller than the dimension h' shown in the design represented in FIG. 7A. A lower dimension h is significant as it allows for enhanced overall sleekness of design and lower profile and lower overall elevation. When wall mounted, a thermostat having a lower profile will protrude from the wall less and therefore is more elegant, modern and visually pleasing as well as less likely to be inadvertently bumped and possibly damaged as a result. According to some embodiments, the thermostat employing the outwardly radially directed optical sensor such as shown in FIG. 7B protrudes from the wall when wall mounted less than 35 mm. According to some embodiments, the thermostat protrudes from the wall a total of 32 mm. An additional advantage of the design shown FIG. 7B over the one represented in FIG. 7A is that the shape and structure of the ring 512 is both easier to manufacture, and is more structurally robust than a ring such as ring 772 that has a substantial surface parallel to the wall. Such qualities can both lower manufacturing cost as well as improve overall fit and finish of the end product.

Figure 7C:
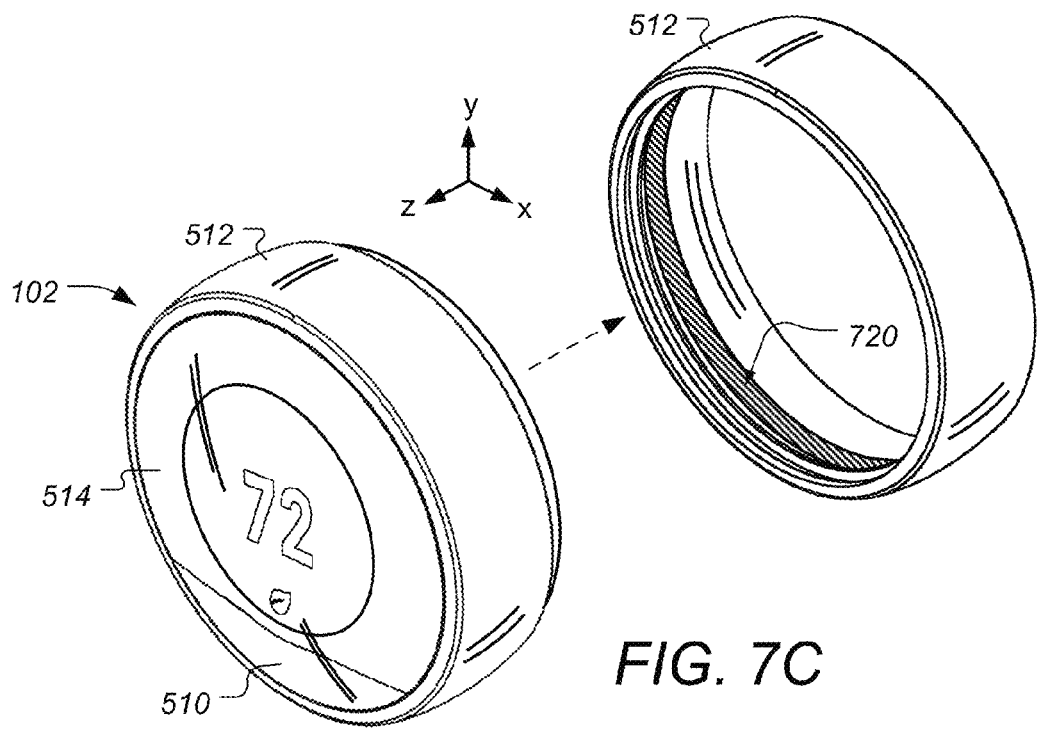
FIGS. 7C-7D are perspective views showing the inner textured surface of the rotating ring, according to some embodiments.
Figure 7D:
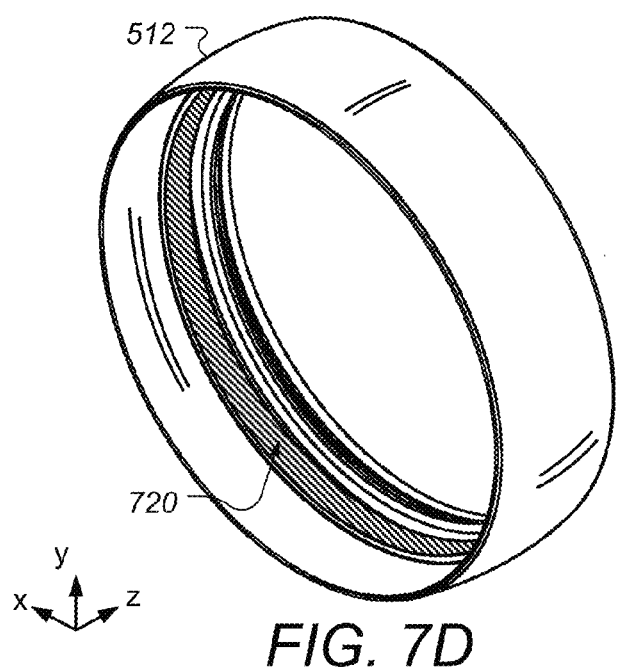

FIGS. 7C-7D are perspective views showing the inner textured surface of the rotating ring, according to some embodiments. In FIG. 7C the ring 512 is shown in relationship to the entire thermostat 102. The textured surface 720 is shown on the curved inner surface of both the front perspective view of FIG. 7C and the rear perspective view of FIG. 7D.

Figure 7E:
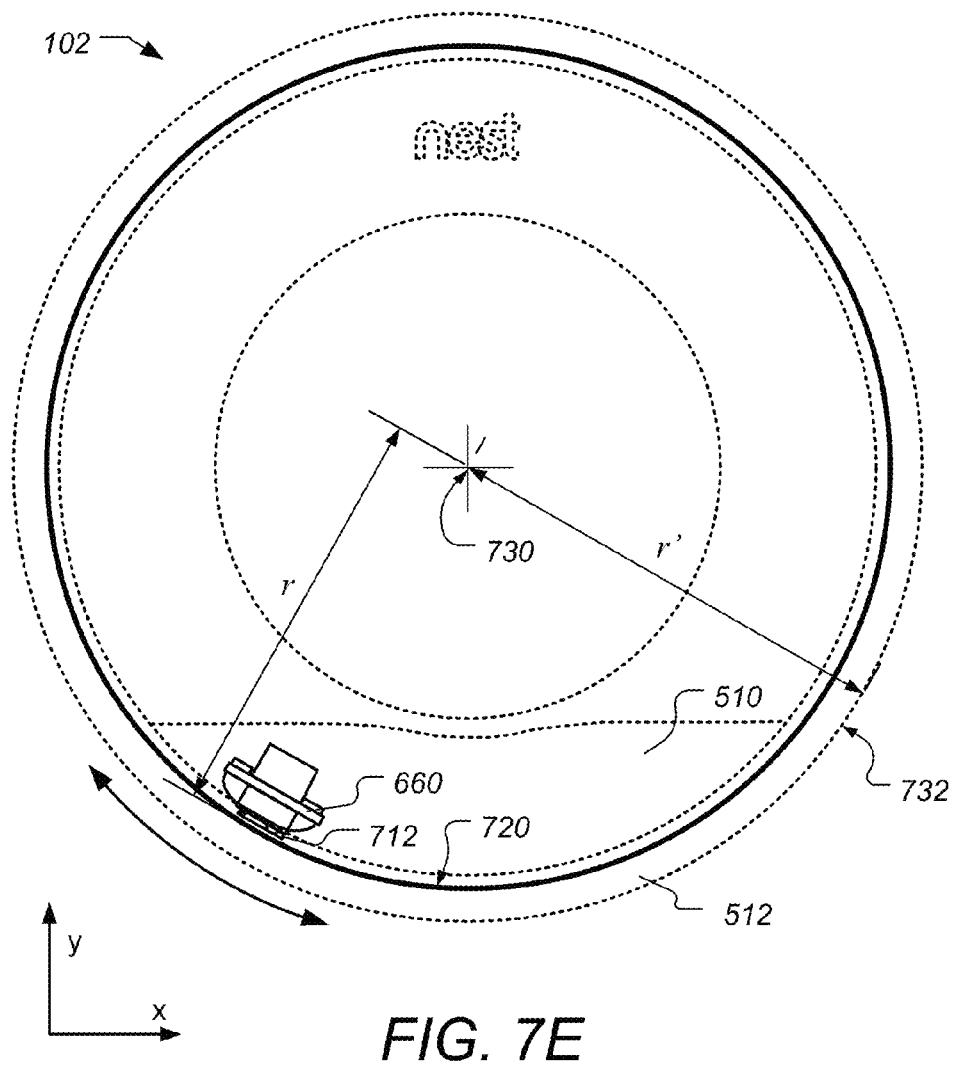
FIG. 7E shows the relationship between the optical sensor, textured surface of the rotating ring, and central axis of the thermostat, according to some embodiments.

FIG. 7E shows the relationship between the optical sensor 712, textured surface 720 of rotating ring 512, and central axis 730 of the thermostat 102, according to some embodiments. As can be seen the textured surface 720 and the optical sensor 712 are mounted very close to the outmost periphery 732 of the thermostat 102. In other words, the radial distance r from the central axis 730 to the textured surface 720 is close to the radial distance r' from the central axis to the outer periphery 732 of ring 512. In the design shown, for example, the ratio of r/r' is greater than 90 percent. According to some embodiments the ratio of r/r' is preferably greater than 75 percent. By positioning the optical sensor 712 to sense ring motion near the outer edge of the rotating ring 512 is advantageous over a more central location, such as designs in which a sensor is directly inwardly towards a rotating surface relatively close to the central rotating axis, because of increased sensitivity to detection motion. For a given amount of rotational displacement of the rotating ring, an outward positioned sensor will view a larger length of moving material than would a more centrally positioned sensor. Furthermore, the design shown herein is also provides an additional advantage over designs with a central rotating post in that the sensing surface, that is surface 720 on ring 512 is very close the same elevation from the wall (in the z-direction) from the user's hand as the user grasps the ring 512. Additionally, the design shown herein completely eliminates the need for any central post or other central rotating member. Rather in the design shown herein, the central area of the thermostat 102 is unobstructed by central rotating pieces and thus allows for relatively compact placement and positioning of the various thermostat components.

Figure 8:
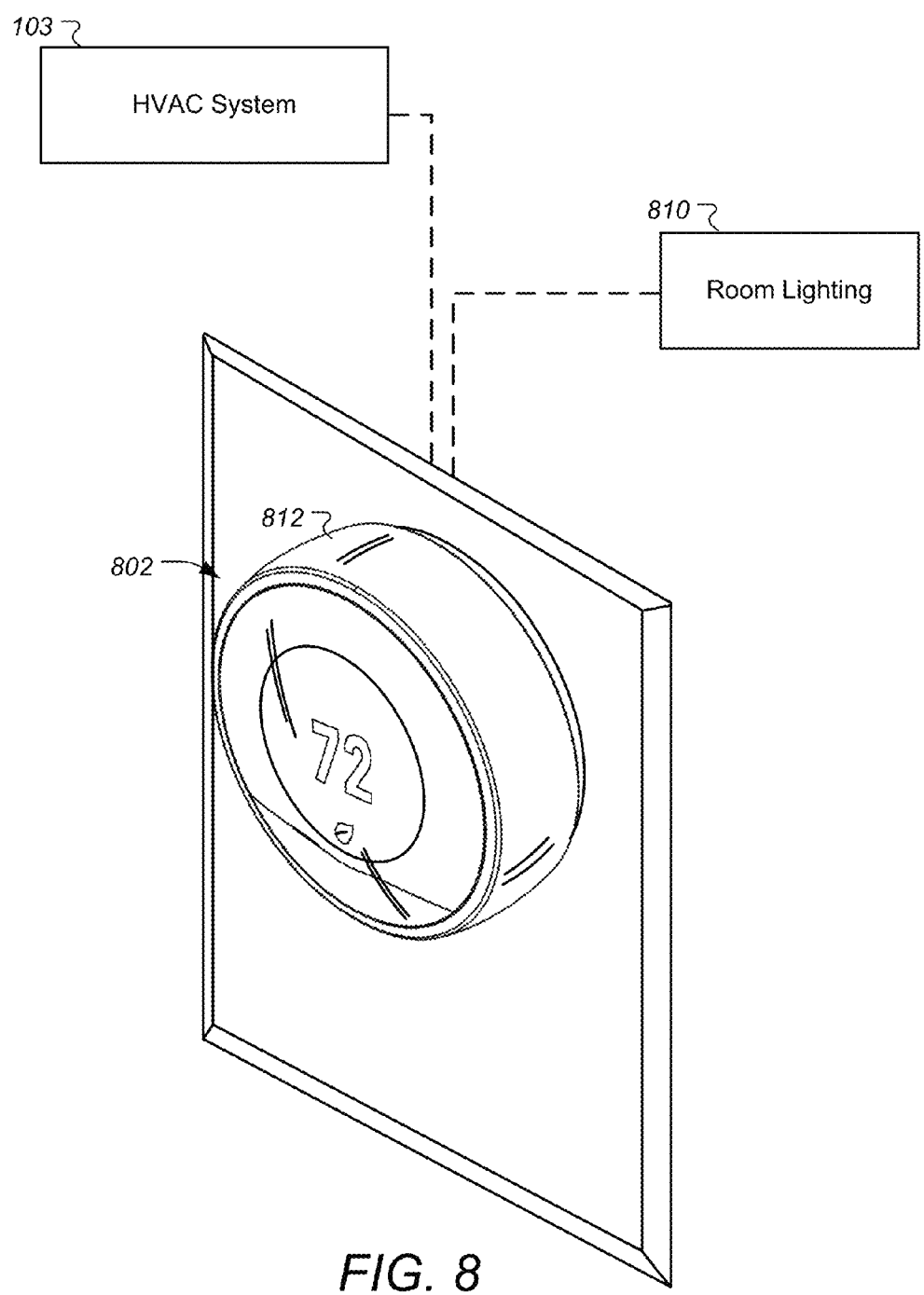
FIG. 8 shows a multi functional controller that uses the rotating ring to control both an HVAC system and room lighting, according to some embodiments.

Although the outward radially directed optical sensor for control ring movements has been thus far described with respect to a thermostat, according to some embodiments the concepts and techniques described herein can be used in a number of other devices for which a combination of accurate user input detection and a sleek low profile visually pleasing exterior design is important. Examples include rotating dials and/or rotating controllers for use with many of the devices and appliance shown and/or described with respect to FIG. 1, including: rotating dials and/or rotating controllers used on appliances (ovens, microwaves, extractor fans, washers, dryers, dishwashers, blenders, coffee makers, wall air conditioners); rotating dials and/or rotating controllers on other home/ residential equipment (pool heater controls, irrigation controls, volume control on intercom systems); rotating dials and/or rotating controllers on light switches (dimmers or selectors); and rotating dials and/or rotating controllers on home entertainment devices (e.g. volume for stereos, televisions). For example, FIG. 8 shows a multi functional controller 802 that uses the rotating ring 812 to control both an HVAC system 103 and room lighting 810. According to some embodiments, the controller 802 can be retrofitable to replace an existing light switch, and the control ring 812 serves in one mode as a thermostat controller for HVAC system 103 and in another mode as a light dimmer switch for room lighting 810. It will be appreciated that the rotating ring controller as described herein can be used for other combinations of devices, such as those shown and described with respect to FIG. 1.

Various modifications may be made without departing from the spirit and scope of the invention. It is to be further appreciated that the term thermostat, as used hereinabove and hereinbelow, can include thermostats having direct control wires to an HVAC system, and can further include thermostats that do not connect directly with the HVAC system, but that sense an ambient temperature at one location in an enclosure and cooperatively communicate by wired or wireless data connections with a separate thermostat unit located elsewhere in the enclosure, wherein the separate thermostat unit does have direct control wires to the HVAC system. Accordingly, the invention is not limited to the above-described embodiments, but instead is defined by the appended claims in light of their full scope of equivalents.

What is claimed is:

1. A thermostat for controlling an HVAC system comprising:
    a housing;
    a processing system disposed with in the housing;
    a rounded electronic display coupled to the processing system and mounted on the housing and adapted to display information to a user;
    a ring-shaped control member mounted on the housing so as to surround the rounded display and rotate about a central axis, the ring-shaped control member being configured to be inwardly pressable by the user along a direction of the central axis; and
    an optical sensor mounted within the housing and directed away from the central axis and toward a radially inward-facing surface of the ring-shaped control member, so as to detect optical signals indicating rotational movement of the ring-shaped control member and generate electrical signals therefrom, wherein the processing system is adapted and configured to detect user input based on the electrical signals generated by the optical sensor.

2. A thermostat according to claim 1 wherein the radially inward-facing surface of the ring-shaped control member is curved and is textured to enhance detection of the optical signals indicating rotational movement.

3. A thermostat according to claim 1 wherein the thermostat housing is adapted to be mounted on a wall.

4. A thermostat according to claim 3 wherein the thermostat is dimensioned such that when mounted on the wall, the thermostat protrudes from the wall no more than 35 millimeters.

5. A thermostat according to claim 4 wherein the thermostat is dimensioned such that when mounted on the wall, the thermostat protrudes from the wall no more than 32 millimeters.

6. A thermostat according to claim 1 wherein the optical sensor is an optical finger navigation module.

7. A thermostat according to claim 1 wherein a ratio of (1) a radial distance between the central axis and the inward-facing surface of the ring-shaped control member and (2) a radial distance between the central axis and an outmost periphery of the ring-shaped control member is not less than 75 percent.

8. A thermostat according to claim 1 wherein a ratio of (1) a radial distance between the central axis and the inward-facing surface of the ring-shaped control member and (2) a radial distance between the central axis and an outmost periphery of the ring-shaped control member is not less than 90 percent.

9. A thermostat according to claim 1 wherein the inward-facing surface of the ring-shaped control member is parallel to the central axis.

10. A thermostat according to claim 1 wherein the housing is generally disk-like in shape, said display is circular, and wherein the ring-shaped control member generally makes up an outer lateral periphery of said disk-like shape.

11. A thermostat according to claim 1 wherein said rotational movement and inward pressings of the ring-shaped control member represent sole physical user inputs to said thermostat.

12. A thermostat for controlling an HVAC system comprising:
- a housing including a head unit and a backplate, the backplate being configured to be mounted on a wall and the head unit being configured to be removably mounted to the backplate;
- a processing system disposed with in the head unit;
- a rounded electronic display coupled to the processing system and mounted on the head unit and adapted to display information to a user;
- a ring-shaped control member rotatably mounted on the head unit so as to surround the rounded display, to rotatable about a central axis and to be inwardly pressable in a direction parallel to the central axis; and
- an optical sensor mounted within the head unit and directed away from the central axis and toward a curved radially inward-facing surface of the ring-shaped control member, so as to detect optical signals indicating rotational movement of the ring-shaped control member and generate electrical signals therefrom, wherein the processing system is adapted and configured to detect user input based on the electrical signals generated by the optical sensor.

13. A thermostat according to claim 12 wherein the thermostat is generally disk-like in shape and dimensioned such that when mounted on the wall, the thermostat protrudes from the wall no more than 35 millimeters, and the ring-shaped control member has a solid smooth metallic outwardly facing surface visible to and touchable by the user that generally makes up an outer lateral periphery of said disk-like shape.

14. A thermostat according to according to claim 13 wherein the outwardly facing surface of the ring-shaped control member is outwardly curved so as to bulge in a radially outward direction from the central axis.

* * * * *